US006486543B1

(12) United States Patent
Sano et al.

(10) Patent No.: US 6,486,543 B1
(45) Date of Patent: Nov. 26, 2002

(54) PACKAGED SEMICONDUCTOR DEVICE HAVING BENT LEADS

(75) Inventors: Masashi Sano, Kyoto (JP); Nobuaki Suzuki, Kyoto (JP); Shinishi Suzuki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/700,631

(22) PCT Filed: Apr. 30, 1999

(86) PCT No.: PCT/JP99/02357

§ 371 (c)(1), (2), (4) Date: Nov. 17, 2000

(87) PCT Pub. No.: WO99/60626

PCT Pub. Date: Nov. 25, 1999

(30) Foreign Application Priority Data

May 20, 1998 (JP) ........................................ 10-138691
May 20, 1998 (JP) ........................................ 10-138692
Aug. 31, 1998 (JP) ........................................ 10-246023

(51) Int. Cl.[7] ........................................ H01L 23/06
(52) U.S. Cl. ........................ 257/684; 257/99; 438/106; 438/116
(58) Field of Search ........................ 257/99, 79, 731, 257/668, 684; 438/106, 116

(56) References Cited

U.S. PATENT DOCUMENTS 5,291,038 A * 3/1994 Hanamoto et al. ............ 257/82
5,706,177 A 1/1998 Nather et al. ............... 361/768
5,760,422 A 6/1998 Ishinaga ...................... 257/94
6,277,301 B1 * 8/2001 Hohn et al. ............ 252/301.36
6,344,689 B1 * 2/2002 Suzuki et al. ............... 257/731

FOREIGN PATENT DOCUMENTS

| | | | |
|---|---|---|---|
| JP | 05-243442 | 9/1993 | H01L/23/48 |
| JP | 07-099277 | 4/1995 | H01L/23/48 |
| JP | 08-330343 | 12/1996 | H01L/21/56 |
| JP | 10-051034 | 2/1998 | H01L/33/00 |

* cited by examiner

*Primary Examiner*—Richard Elms
*Assistant Examiner*—Brad Smith
(74) *Attorney, Agent, or Firm*—Michael D. Bednarek; Shaw Pittman LLP

(57) ABSTRACT

A semiconductor device (X1) including a semiconductor chip (3), a first lead (1) connected to an electrode of the semiconductor chip (3), a second lead (2) connected to another electrode of the semiconductor chip (3), and a resin package (4) sealing the semiconductor chip (3), an inner terminal (10) of the first lead (1), and an inner terminal (20) of the second lead (2). The resin package (4) includes a first to a fourth side surfaces (41–44), an upper surface (47) and a bottom surface (45). Each of the first and the second leads (1, 2) includes at least one outer terminal (11, 21) extending along the first side surface (41) and the bottom surface (45) of the resin package (4).

13 Claims, 20 Drawing Sheets

PACKAGED SEMICONDUCTOR DEVICE HAVING BENT LEADS

TECHNICAL FIELD

The present invention relates to a resin-packaged semiconductor device surface-mountable onto an object surface such as a circuit substrate, and more specifically, to a semiconductor device suitably used as a light emitter or a light receiver of an optical sensor.

BACKGROUND ART

Referring to the attached drawings, FIG. 29 and FIG. 30 show a typical conventional resin-packaged semiconductor device. This semiconductor device Y is a light emitting diode (LED) of a so-called frame type, made from a lead frame obtained by punching a metal plate for example.

Specifically, the light emitting diode Y comprises a pair of leads 1, 2 respectively including inner terminals 10, 20 and outer terminals 11, 21, a semiconductor chip (light emitting element) 3 mounted to the inner terminal 10 of the lead 1, a wire W for connecting an upper surface 30 of the light emitting element 3 to the inner terminal 20 of the other lead 20, and a resin package 4 for sealing the inner terminals 10, 20 of the leads 1, 2, the light emitting element 3 and the wire W. The resin package 4 is formed to have a convex lens 46 right above the light emitting element 3. Each of the outer terminals 11, 21 is bent like a crank so that the tip portion 11*a*, 21*b* is flush with a bottom surface 45 of the resin package 4.

With the above arrangement, the light emitting diode Y is surface-mounted on an object surface 5 such as a circuit substrate, and used as a light source for various purposes such as a light source of an optical sensor. When the light emitting diode Y is surface-mounted to the object surface 5, so called solder re-flow method is generally used. When the light emitting diode Y is mounted by means of the solder re-flow method, first, cream solder is applied to the tip portions 11*a*, 21*a* of the outer terminals 11, 21 for example. Then, the light emitting diode Y is lowered, with its tip portions 11*a*, 21*a* being aligned with their corresponding terminal pads 50 on the object surface 5, and then is placed in a re-flow furnace. In the re-flow furnace, the solder paste is re-melted under a temperature of about 200° C. When the melted solder sets again, the light emitting diode Y is fixed on the object surface 5, completing the mounting process.

However, according to the light emitting diode Y, only the tip portions 11*a*, 21*a* of the outer terminals 11, 21 serve as the mounting portions to be fixed onto the object surface 5. This unitary determines the direction in which the light emitting diode Y can be faced. Specifically, if the upper surface 30 of the light emitting element 3 serves as the light emitting surface, the light emitting diode Y can only be mounted so as to emit light upward with respect to the object surface 5, or in other words, the light emitting diode Y cannot be mounted for emitting in parallel to the object surface 5. Therefore, in order to emit in parallel to the object surface 5, another light emitting diode must be prepared in which the emitting surface is vertical with respect to the bottom surface 45 (mounting surface) of the resin package 4. As exemplified as above, according to the conventional light emitting diode, there is an inconvenience in that different kinds of the light emitting diode must be prepared depending on the direction in which the light is to be emitted. The same inconvenience can also pose a problem in such semiconductor devices as a photodiode and a phototransistor in which a light receiving element is used as the semiconductor device chip 3.

DISCLOSURE OF THE INVENTION

It is therefore an object of the present invention to provide a semiconductor device capable of solving the above described problem.

According to a first aspect of the present invention, there is provided a semiconductor device comprising a semiconductor chip, a first lead connected to an electrode of the semiconductor chip, a second lead connected to another electrode of the semiconductor chip, and a resin package sealing the semiconductor chip, an inner terminal of the first lead, and an inner terminal of the second lead, wherein the resin package includes a first to a fourth side surfaces, an upper surface and a bottom surface, and each of the first and the second leads includes at least one outer terminal located near a corner portion of the resin package and extending along a same side surface of the first to the fourth side surfaces and the bottom surface of the resin package.

According to the above arrangement, an anode/cathode pair is formed at least in one of the side surfaces and in the bottom surface of the resin package. Therefore, when mounting the semiconductor device onto an object surface such as a circuit substrate, either of said one side surface and the bottom surface can be selected as a mounting surface.

According to an embodiment of the present invention, the outer terminal of the first lead includes a drop portion extending from the corresponding inner terminal along the first side surface of the resin package, a bottom portion extending from the drop portion along the bottom surface of the resin package, and a riser portion extending from the bottom portion along the third side surface of the resin package. The outer terminal of the second lead includes a drop portion extending from the corresponding inner terminal along the first side surface of the resin package, a bottom portion extending from the drop portion along the bottom surface of the resin package, and a riser portion extending from the bottom portion along the fourth side surface opposite to the third side surface of the resin package.

According to another embodiment of the present invention, the outer terminal of the first lead includes a drop portion extending from the corresponding inner terminal along the first side surface of the resin package, a bottom portion extending from the drop portion along the bottom surface of the resin package, and a riser portion extending from the bottom portion along the third side surface of the resin package, wherein the outer terminal of the second lead includes, a drop portion extending from the corresponding inner terminal along the second side surface opposite to the first side surface of the resin package, a bottom portion extending from the drop portion along the bottom surface of the resin package, and a riser portion extending from the bottom portion along the third side surface of the resin package.

According to still another embodiment of the resent invention, the outer terminal of the first lead includes a drop portion extending from the corresponding inner terminal along the third side surface of the resin package, a bottom portion extending from the drop portion along the bottom surface of the resin package, and a riser portion extending from the bottom portion along the third side surface of the resin package, wherein the outer terminal of the second lead includes a drop portion extending from the corresponding inner terminal along the third side surface of the resin package, a bottom portion extending from the drop portion along the bottom surface of the resin package, and a riser portion extending from the bottom portion along the second side surface opposite to the first side surface of the resin package.

According to still another embodiment of the present invention, the outer terminal of the first lead includes two branch portions, and one of the branch portions is bent to extend along the first side surface and the bottom surface of the resin package, whereas the outer terminal of the second lead includes two branch portions, and one of the branch portions is bent to extend along the first side surface and the bottom surface of the resin package. In this case, the other branch portion of the outer terminal of the first lead extends along the first side surface beyond the third side surface of the resin package whereas the other branch portion of the outer terminal of the second lead extends along the first side surface beyond the fourth side surface opposite to the third side surface of the resin package. Alternatively, the other branch portion of the outer terminal of the first lead is bent to extend along the first side surface and the third side surface of the resin package whereas the other branch portion of the outer terminal of the second lead is bent to extend along the first side surface and the fourth side surface opposite to the third side surface of the resin package.

According to still another embodiment of the present invention, the outer terminal of the first lead includes two branch portions, one of the branch portions is bent to extend along the first side surface and the bottom surface of the resin package, and the other branch portion is bent to extend along the first side surface and the third side surface of the resin package, whereas the outer terminal of the second lead includes two branch portions, one of the branch portions is bent to extend along the second side surface opposite to the first side surface and the bottom surface of the resin package, and the other branch portion is bent to extend along the second side surface and the third side surface of the resin package.

According to still another embodiment of the present invention, the outer terminal of the first lead includes two branch portions, one of the branch portions is bent to extend along the third side surface and the bottom surface of the resin package, whereas the outer terminal of the second lead includes two branch portions, and one of the branch portions is bent to extend along the third side surface and the bottom surface of the resin package. In this case, the other branch portion of the outer terminal of the first lead extends along the third side surface beyond the first side surface of the resin package, and the other branch portion of the outer terminal of the second lead extends along the third side surface beyond the second side surface opposite to the first side surface of the resin package. Alternatively, the other branch portion of the outer terminal of the first lead is bent to extend along the third side surface and the first side surface of the resin package, whereas the other branch portion of the outer terminal of the second lead is bent to extend along the third side surface and the second side surface opposite to the first side surface of the resin package.

Preferably, the semiconductor chip is mounted on the inner terminal of the first lead, and the inner terminal of the second lead is connected to the semiconductor chip via a wire. Further, it is especially advantageous if the connection between the inner terminal of the second lead and the wire is made generally at a longitudinal center of the resin package. Further, if the semiconductor chip is a light emitting element or a light receiving element, the upper surface of the resin package may be provided with a convex lens portion at a location corresponding to the semiconductor chip.

According to a second aspect of the present invention, there is provided a semiconductor device comprising a semiconductor chip a resin package sealing the semiconductor chip, four outer terminals outside of the resin package, electrically connected to the semiconductor chip, wherein the resin package includes four side surfaces, an upper surface and a bottom surface, the four outer terminals are disposed respectively at four corners on the bottom surface, and each of the outer terminals extends along a selected one of the side surfaces and the bottom surface of the resin package.

According to an embodiment of the second aspect of the present invention, each of the outer terminals includes a drop portion extending along the selected side surface of the resin package, a bottom portion extending from the drop portion along the bottom portion of the resin package, and a riser portion extending from the bottom portion along another side surface of the resin package adjacent to the selected side surface.

According to another embodiment of the second aspect of the present invention, each of the outer terminals includes two branch portions, one of the two being bent to extend along the selected side surface and the bottom surface of the resin package. In this case, the other branch portion of each outer terminal extends along the selected side surface beyond another of the side surfaces adjacent to the selected side surface of the resin package. Alternatively, the other branch portion of each outer terminal is bent to extend along the selected side surface and another of the side surfaces adjacent to the selected side surface of the resin package.

Preferably, two of the four outer terminals are connected together by a first inner terminal, the remaining two of the outer terminals are connected together by a second inner terminal, the semiconductor chip is mounted on the first inner terminal, and the second inner terminal is connected to the semiconductor chip via a wire. Further it is especially advantageous that the connection between the second inner terminal and the wire is made generally at a longitudinal center of the resin package. Still further, if the semiconductor chip is a light emitting element or a light receiving element, the upper surface of the resin package may be provided with a convex lens portion at a location corresponding to the semiconductor chip.

According to a third aspect of the present invention, there is provided a semiconductor device comprising a semiconductor chip, a first lead connected to an electrode of the semiconductor chip, a second lead connected to another electrode of the semiconductor chip, and a resin package sealing the semiconductor chip, an inner terminal of the first lead, and an inner terminal of the second lead, wherein the semiconductor chip is mounted on the inner terminal of the first lead, the inner terminal of the second lead is connected to the semiconductor chip via a wire, the wire extends in parallel to one side surface of the resin package, each of the first and the second leads having at least one outer terminal extending out of the resin package from corresponding inner terminal through the side surface, and the connection between the inner terminal of the second lead and the wire is made generally at a center, as seen in plan view, of the resin package.

According to a preferred embodiment of the third aspect of the present invention, the semiconductor chip is a light emitting element or a light receiving element, and the upper surface of the resin package is provided with a convex lens portion at a location corresponding to the semiconductor chip. Further, the inner terminal of the first lead is provided with a tongue extending toward the second lead for mounting the semiconductor chip, and the inner terminal of the second lead is provided with a tongue extending toward the first lead for connection to the wire.

Other objects, characteristics, and advantages of the present invention will become clearer from the following description of embodiments to be presented with reference to the accompanying drawings.

BEST MODE FOR CARRYING OUT THE INVENTION

Now, preferred embodiments of the present invention will be described specifically, with reference to the accompanying drawings.

Figure 29:
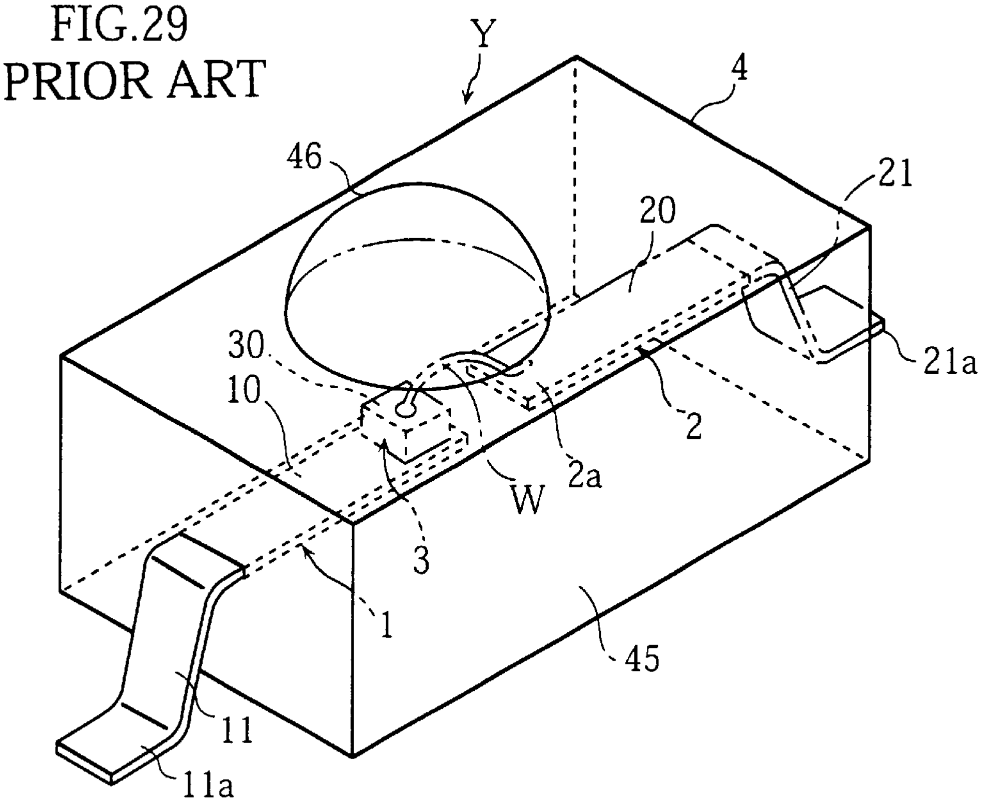
FIG. 29 is a perspective view of a conventional semiconductor device.
Figure 30:
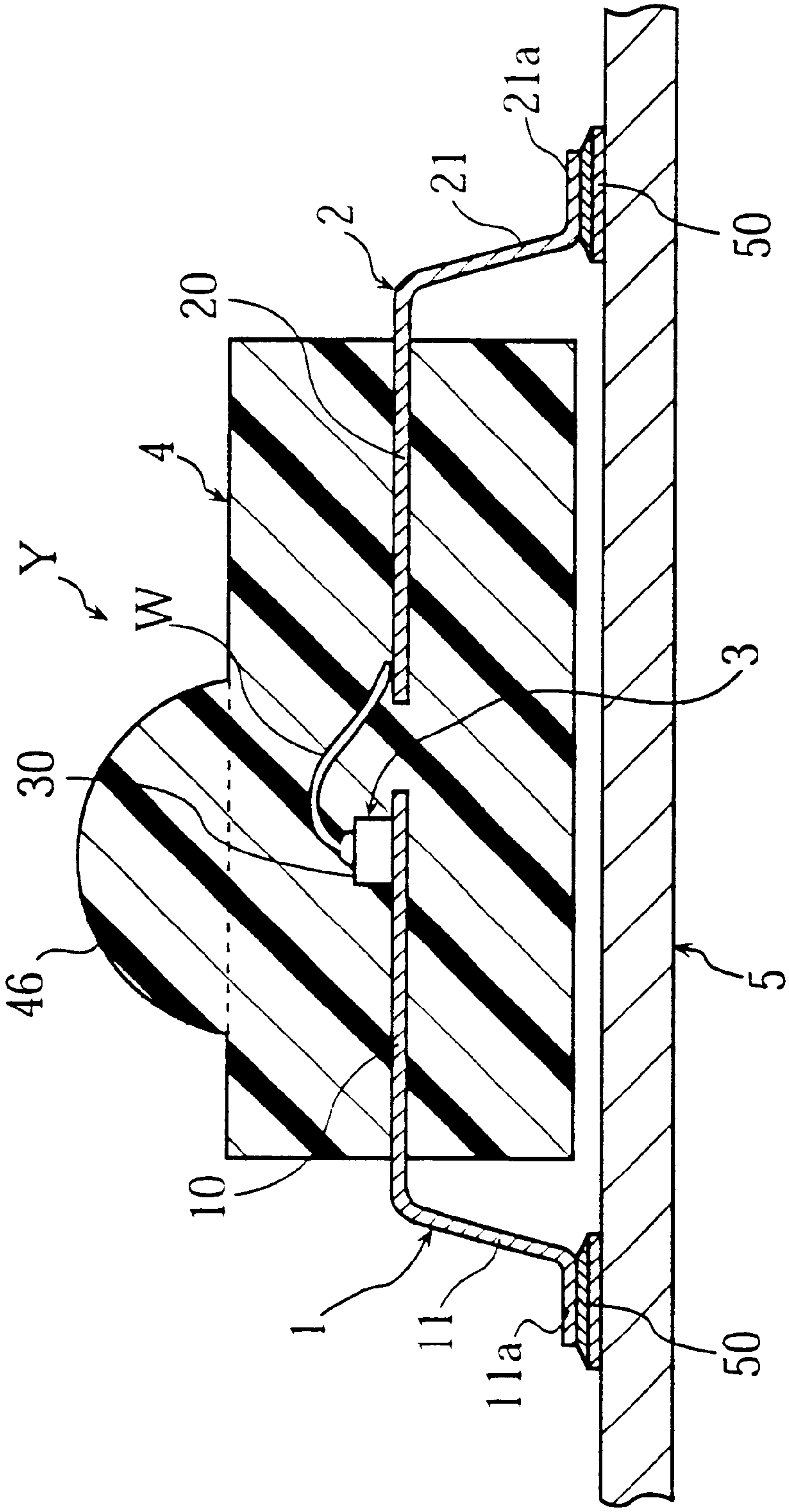
FIG. 30 is a sectional view of the conventional semiconductor device mounted on an object surface such as a circuit substrate.

FIGS. 1 to 4 show a semiconductor device according to a first embodiment of the present invention. It should be noted here that in these figures (and also in FIGS. 5 to 28), components identical with or similar to those in the conventional semiconductor device (shown in FIGS. 29 and 30) are indicated by the same alpha-numeral codes.

As shown in FIGS. 1 to 4, the semiconductor device X1 is made from a lead frame obtained by punching out a metal plate for example, and constituted as a light emitting diode according to the present embodiment. The semiconductor device X1 generally comprises a first lead 1 (See FIGS. 3 and 4.) onto which a light emitting element 3 as a semiconductor chip is mounted, a second lead 2 electrically connected to an upper surface 30 of the light emitting element 3 via a wire W, and a resin package 4 formed generally into a rectangular parallelepiped for sealing the light emitting element 3 and the wire W.

The first lead 1 includes an inner terminal 10 sealed within the resin package 4 and outer terminals 11, 12 bent and extended out of the resin package 4.

The inner terminal 10 includes a main portion 10*a* extending in parallel to a bottom surface 45 of the resin package 4 between a first surface 40 and a second surface 41 of the resin package 4. The main portion 10*a* has a center portion formed with a tongue 10*b* projecting therefrom toward a center of the resin package 4. The tongue 10*b* and part of the main portion 10*a* constitute a die bonding region. The die bonding region is closer to a third side surface 43 of the resin package 4. As a result, the light emitting element 3 mounted onto the die bonding region is also closer to the third side surface 43.

The outer terminals 11, 12 are formed continuously from respective end portions of the inner terminal 10. The outer terminals 11, 12 respectively comprise drop portions 11*a*, 12*a* extending downward along the first side surface 41 or the second side surface 42 of the resin package 4, bottom portions 11*b*, 12*b* extending continuously from respective drop portions 11*a*, 12*b* along the bottom surface 45 of the resin package 4 and riser portions 11*c*, 12*c* extending upward from respective bottom portions 11*c*, 12*c* along the third side surface 43. Specifically, the outer terminals 11, 12 surround two corner portions of the bottom surface 45 in the resin package 4.

The second lead 2 includes an inner terminal 20 sealed within the resin package 4, and outer terminals 21, 22 bent and extended out of the resin package 4.

The inner terminal 20 includes a main portion 20*a* extending in parallel to the bottom surface 45 of the resin package 4 between the first surface 40 and the second surface 41 of the resin package 4, and in parallel to the inner terminal 10 of the first lead 1. The main portion 20a has a center portion formed with a tongue 20b projecting therefrom toward the inner terminal 10 of the first lead 1. The tongue 20b serves as a wire bonding region for connecting to the upper surface of the light emitting element 3 via the wire W made of gold for example. The wire bonding region is located at a widthwise center portion of the resin package 4. Further, the connection between the wire W and the tongue 20b is made generally in a widthwise and longitudinal center portion of the resin package 4.

The outer terminals 21, 22 are formed continuously from respective end portions of the second inner terminal 20. Further, the outer terminals 21, 22 respectively comprise drop portions 21a, 22a extending downward along the first side surface 41 or the second side surface 42 of the resin package 4, bottom portions 21b, 22b extending continuously from respective drop portions 21a, 22b along the bottom surface 45 of the resin package 4, and riser portions 21c, 22c extending upward from respective bottom portions 11c, 12c along the fourth side surface 44. As will be understood from the above, the outer terminals 21, 22 of the second lead 2 surround the other two corner portions of the bottom surface 45 in the resin package 4.

As described above, all of the corner portions of the bottom surface 45 of the resin package 4 are substantially protected by the outer terminals 11, 12, 21, 22 of the first and the second leads 1, 2.

The resin package 4 is formed generally into a rectangular parallelepiped by such means as an injection molding using a metal die as will be described later, and includes a generally hemisphere convex lens portion 46 projecting upward. The convex lens portion 46 has a peak portion located right above the light emitting element 3, so that the light emitted from the light emitting element 3 will not scatter in many directions. The light emitting element 3 is placed off the center and closer to the third side surface 43 of the resin package 4. Therefore, the convex lens portion 46 provided right above the light emitting element 3 is also placed closer to the third surface of the resin package 4, leaving a relatively large flat region on the upper surface closer to the fourth side surface 44 of the resin package 4.

Figure 1:
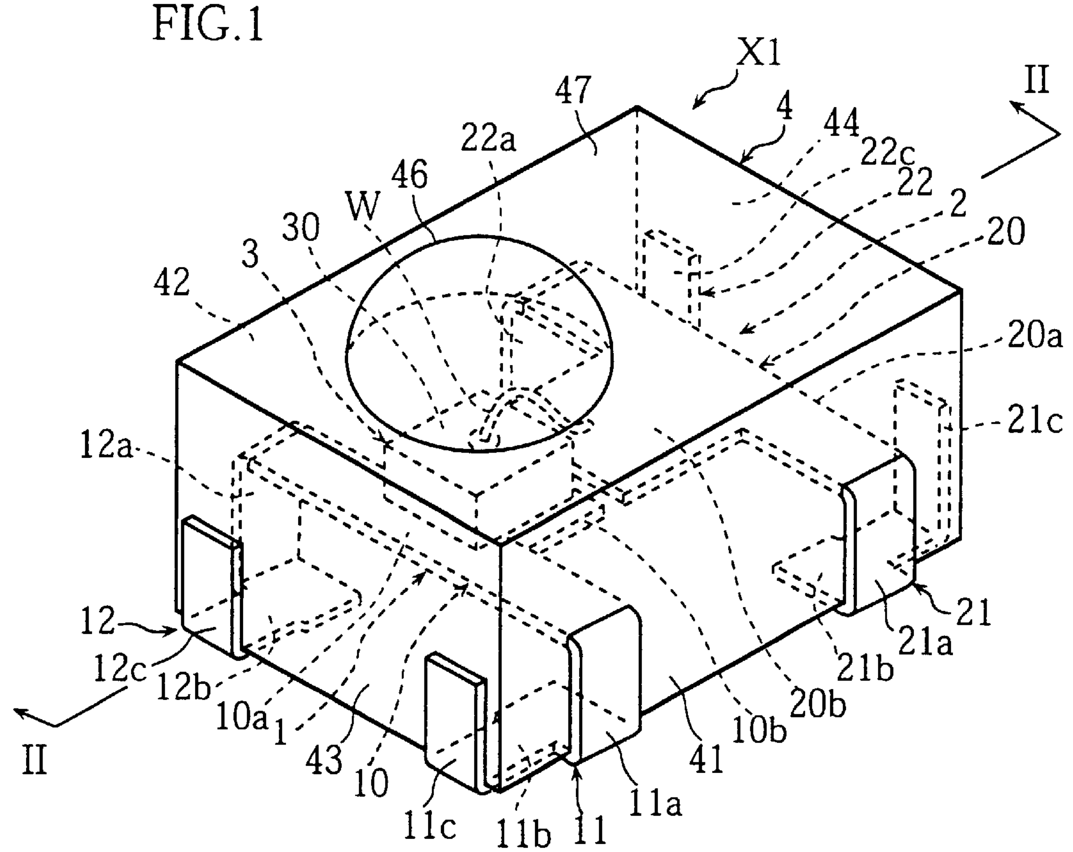
FIG. 1 is a perspective view of a semiconductor device as a first embodiment of the present invention.
Figure 2:
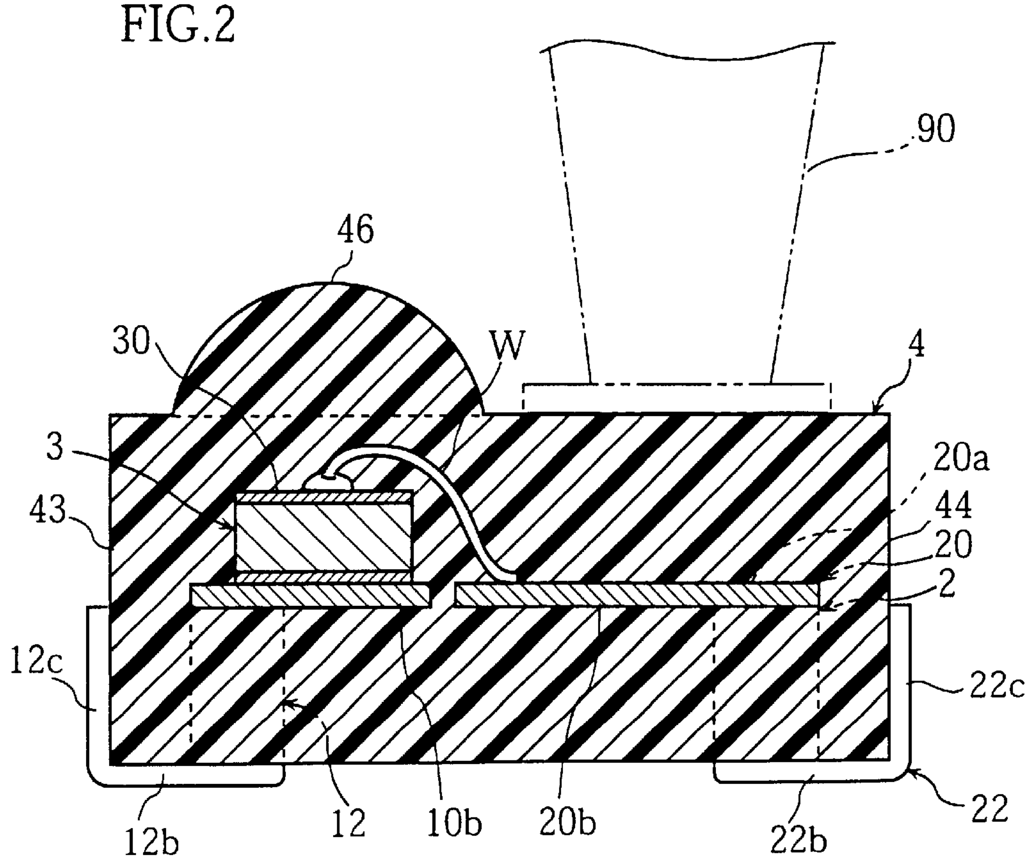
FIG. 2 is a sectional view taken in lines II—II in FIG. 1.
Figure 4:
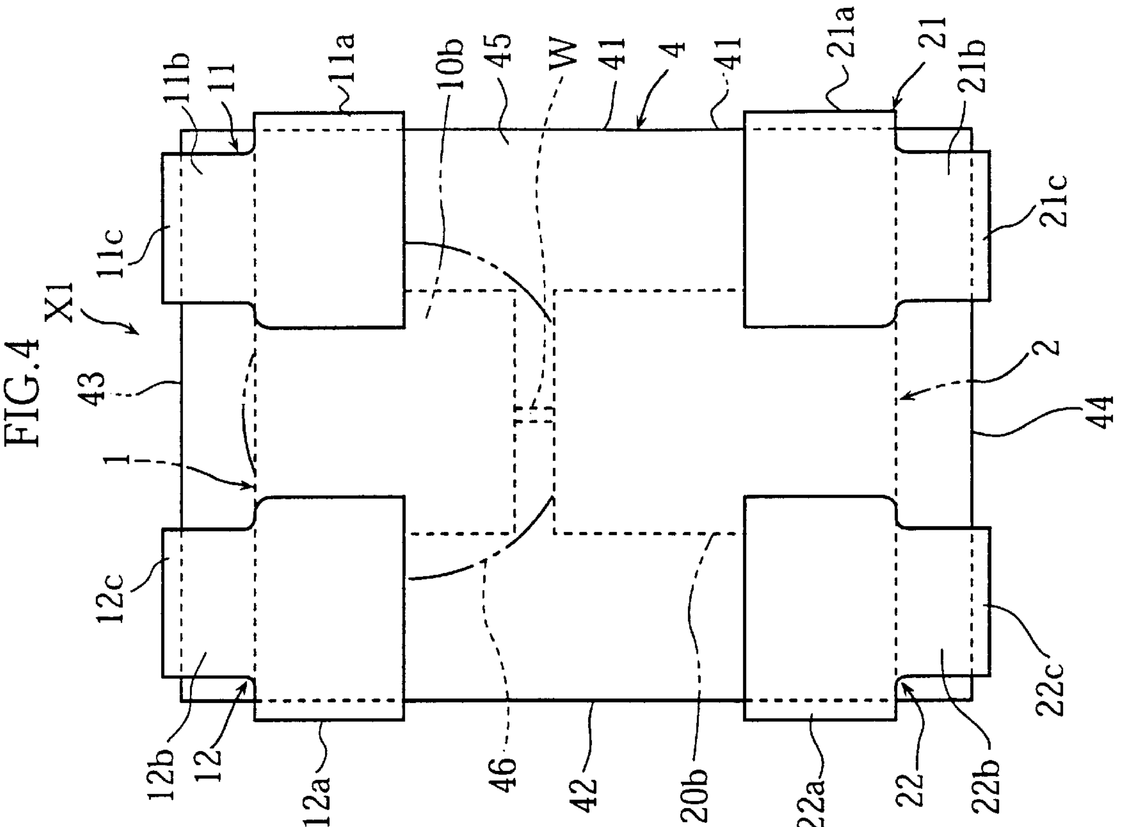
FIG. 4 is a bottom view of the semiconductor device.
Figure 3:
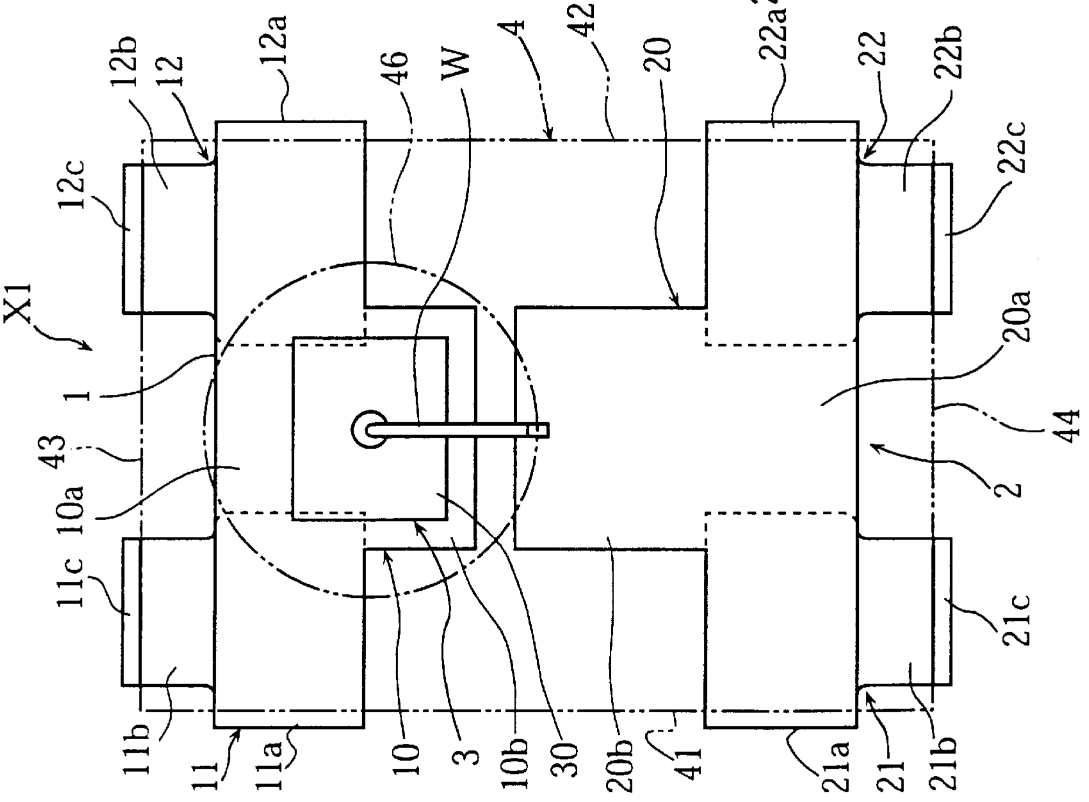
FIG. 3 is a transparent plan view of the semiconductor device.

According to the semiconductor device X1 with the above arrangement, as clearly shown in FIG. 1, the drop portion 11a of the outer terminal 11 of the first lead 1 and the drop portion 21a of the outer terminal 21 of the second lead 2 are located in the first side surface 41 of the resin package 4. Therefore, the first side surface 41 can be used as a mounting surface to an object surface such as a circuit substrate. Further, as is clearly shown in FIG. 3 and FIG. 4, the drop portion 21a of the outer terminal 21 of the first lead 1 and the drop portion 22a of the outer terminal 22 of the second lead 2 are also located in the second side surface 42 of the resin package 4. Therefore, the second side surface 42 can also be used as a mounting surface. Further, as shown clearly in FIG. 4, the bottom surface 45 of the resin package 4 is formed with the bottom portions 11b, 12b, 21b, 22b of respective outer terminals 11, 12, 21, 22. Therefore, the bottom surface 45 can also be used as a mounting surface.

Next, a method for manufacturing the semiconductor device X1 having the above arrangement will be described with reference to FIGS. 5 to 11.

Figure 5:
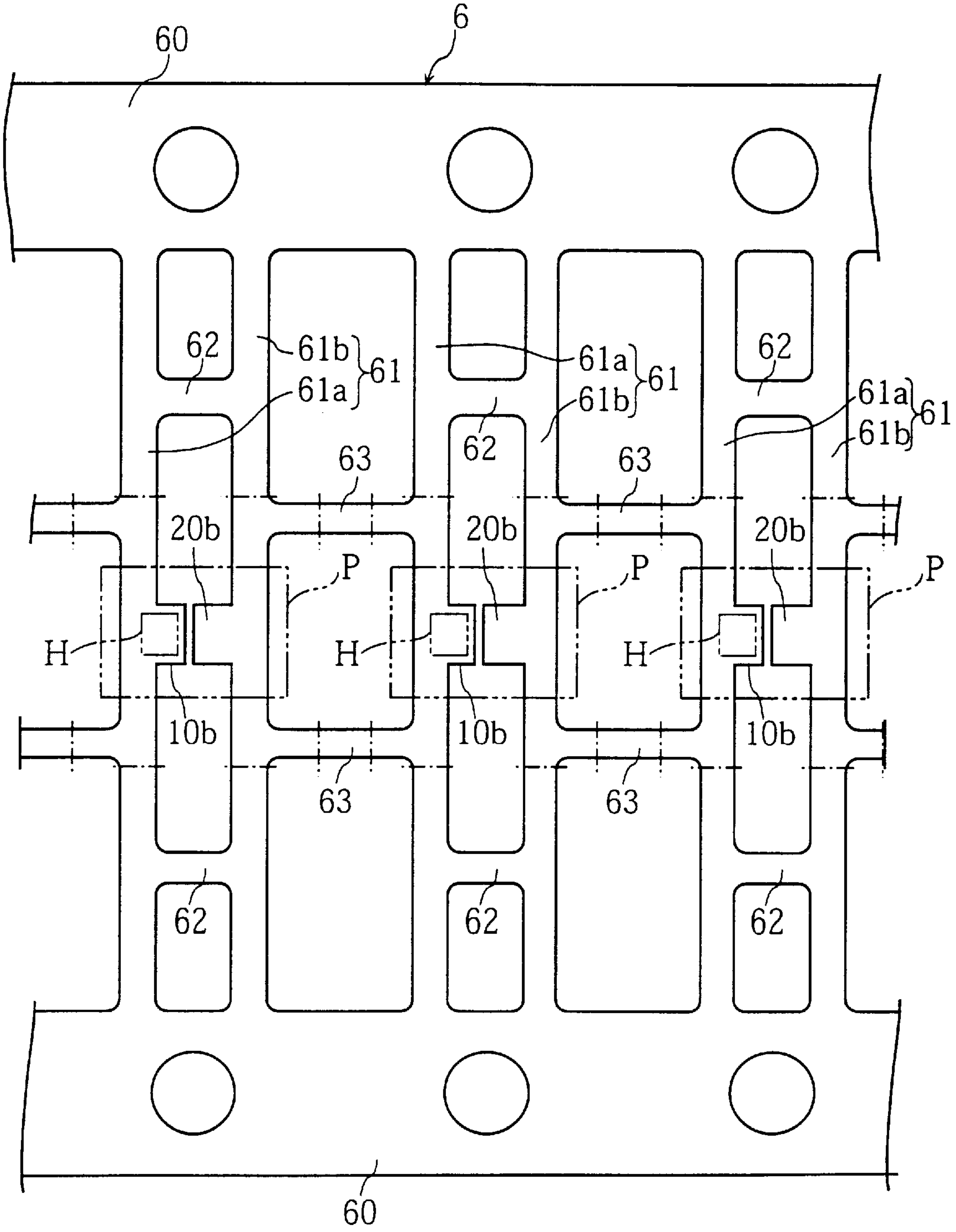
FIG. 5 is a plan view of a lead frame used for manufacture of the semiconductor device.

For the manufacture of the semiconductor device X1, a lead frame 6 as shown in FIG. 5 is used. The lead frame 6 can be obtained by punching out a metal plate made of cupper, iron or a nickel alloy for example, and includes a pair of side bands 60 extending in parallel to each other. Cross member pairs 61, each including a first and a second cross members 61a, 61b are formed at an interval, bridging these side bands 60. The cross members 61a, 61b in each pair are connected to each other by support members 62 at locations closer to the respective side bands 60. Further, the first cross member 61a of each cross member pair 61 is connected to the second cross member 61b of an adjacent cross member pair 61 by two tie bars 63. The tongue 10b is formed by punching as an extension from the first cross member 61a toward the second cross member 61b to provide a rectangular region surrounded by the cross member pair 61 and the corresponding support members 62. Likewise, the tongue 20b is formed by punching as an extension from the second cross member 61b toward the first cross member 61a in an opposing relationship.

In the manufacture of the semiconductor device X1, each of the tongues 10b in the first cross members 61a of the lead frame 6 is mounted with the semiconductor chip 3 (indicated by a region H enclosed by phantom lines) via electrically conductive paste for example. If the semiconductor device X1 is constituted as the light emitting diode as described earlier, the semiconductor chip 3 used is a light emitting element such as a light emitting diode chip. If the semiconductor device X1 is constituted as a photodiode on the other hand, then the semiconductor chip 3 used is a light receiving element such as a photodiode chip, and of course, a different semiconductor chip other than the above mentioned examples may be mounted in accordance with a specific application.

Next, the upper surface 30 (See FIG. 2.) of the semiconductor chip 3 and the second cross member 61b are connected to each other by the wire W. The connecting operation using the wire W includes a first bonding made onto the upper surface 30 of the semiconductor chip 3, and a second bonding made onto the second cross member 61b.

Figure 6:
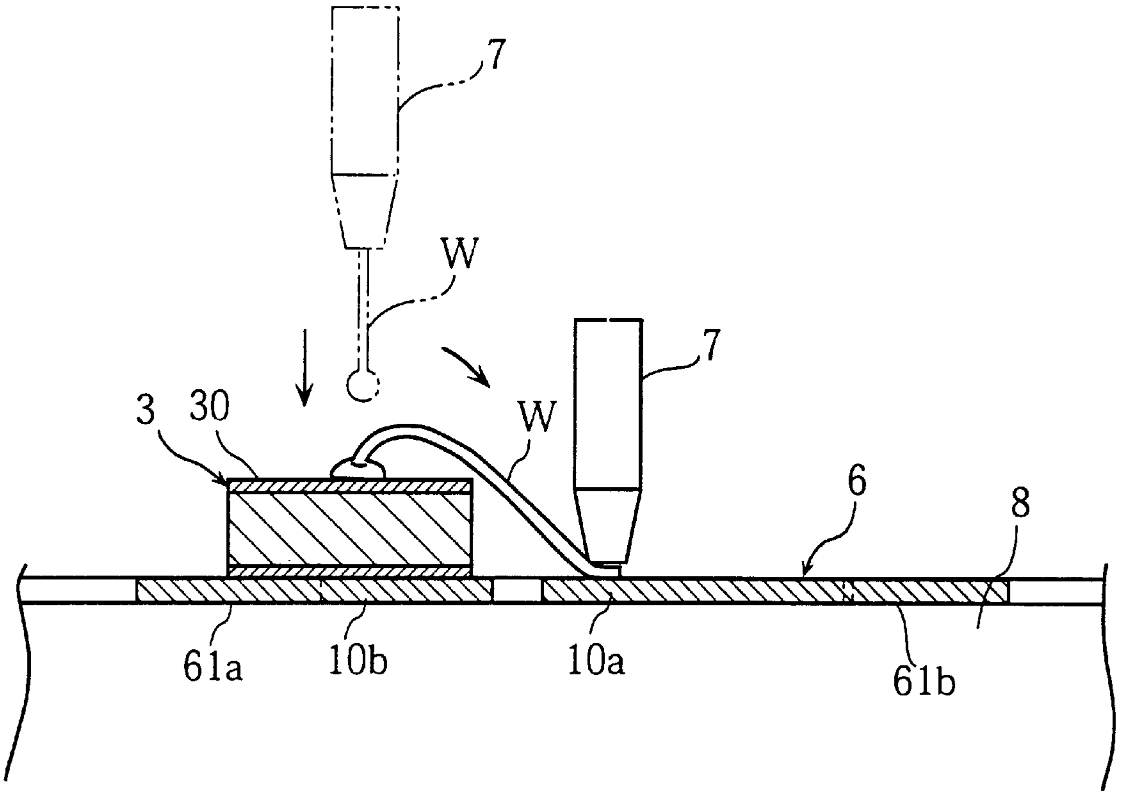
FIG. 6 is a diagram showing a wire-bonding step.

As shown in FIG. 6, the first bonding is performed by first letting a tip portion of the wire W extend out of an end of a capillary 7, then melting the tip portion into a ball of molten, and then pressing the molten ball onto the upper surface of the semiconductor chip 3. The second bonding is performed by first moving the capillary 7 to the tongue 20b (the wire bonding region) of the other cross member 61b while pulling the wire W out of the end of the capillary, and then by press-fixing the wire W. The wire bonding may be performed while heating the lead frame 6 on a supporting table 8. The second bonding may also be performed while supplying ultrasonic wave.

Figure 7:
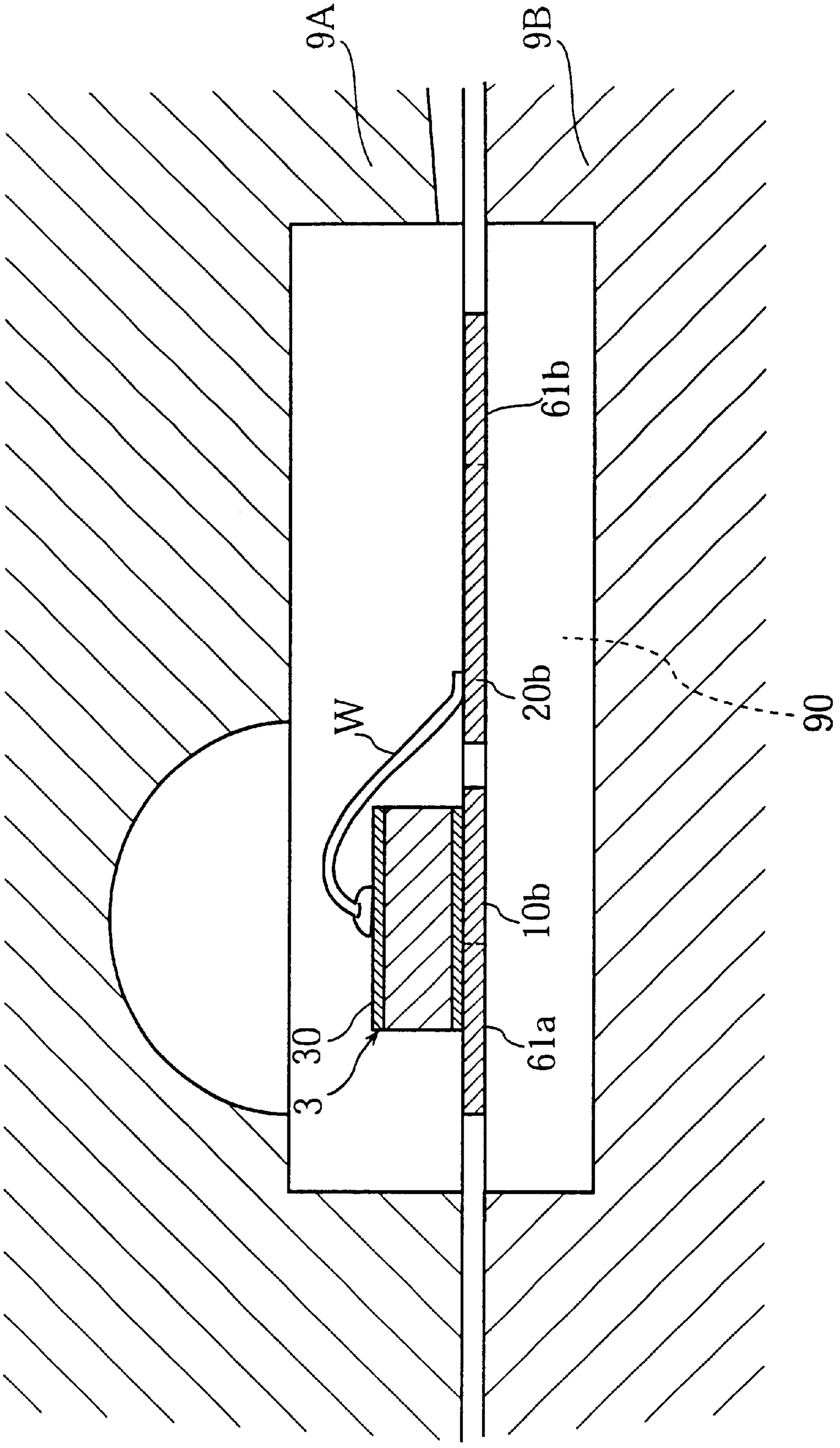
FIG. 7 is a sectional view showing a resin-packaging step.

Next, by using a predetermined metal mold, the resin package 4 (indicated by a region P enclosed by phantom lines in FIG. 5) is formed in the lead frame 6. Specifically, as shown in FIG. 7, the semiconductor chip 3 is housed in a cavity 90 formed by an upper and lower metal molds 9A, 9B, and the metal molds are tightened to each other so as to sandwich the lead frame 6. Then, a molten thermosetting resin such as an epoxy resin is injected into the cavity 90. The injected resin is allowed to set, and then the molds are separated to obtain the resin package 4. At this time, the convex lens portion 46 is formed simultaneously.

If the semiconductor device X1 is constituted as the light emitting diode, a highly transparent resin such as an epoxy resin is suitably used as a material for the resin package 4. Likewise, if the semiconductor chip 3 is a light receiving element such as a photodiode chip and a phototransistor chip, a highly transparent resin such as the epoxy resin is suitably used as a material for the resin package 4. However, for manufacturing the semiconductor device which does not emit or receive light, then the resin package 4 may not necessarily be formed by the highly transparent resin, or it is not necessary to provide the convex lens portion 46. Further, if the light receiving element is an element selectively receive an infrared ray, then the resin package 4 is preferably formed by a black resin which can selectively pass the infrared ray.

Figure 8:
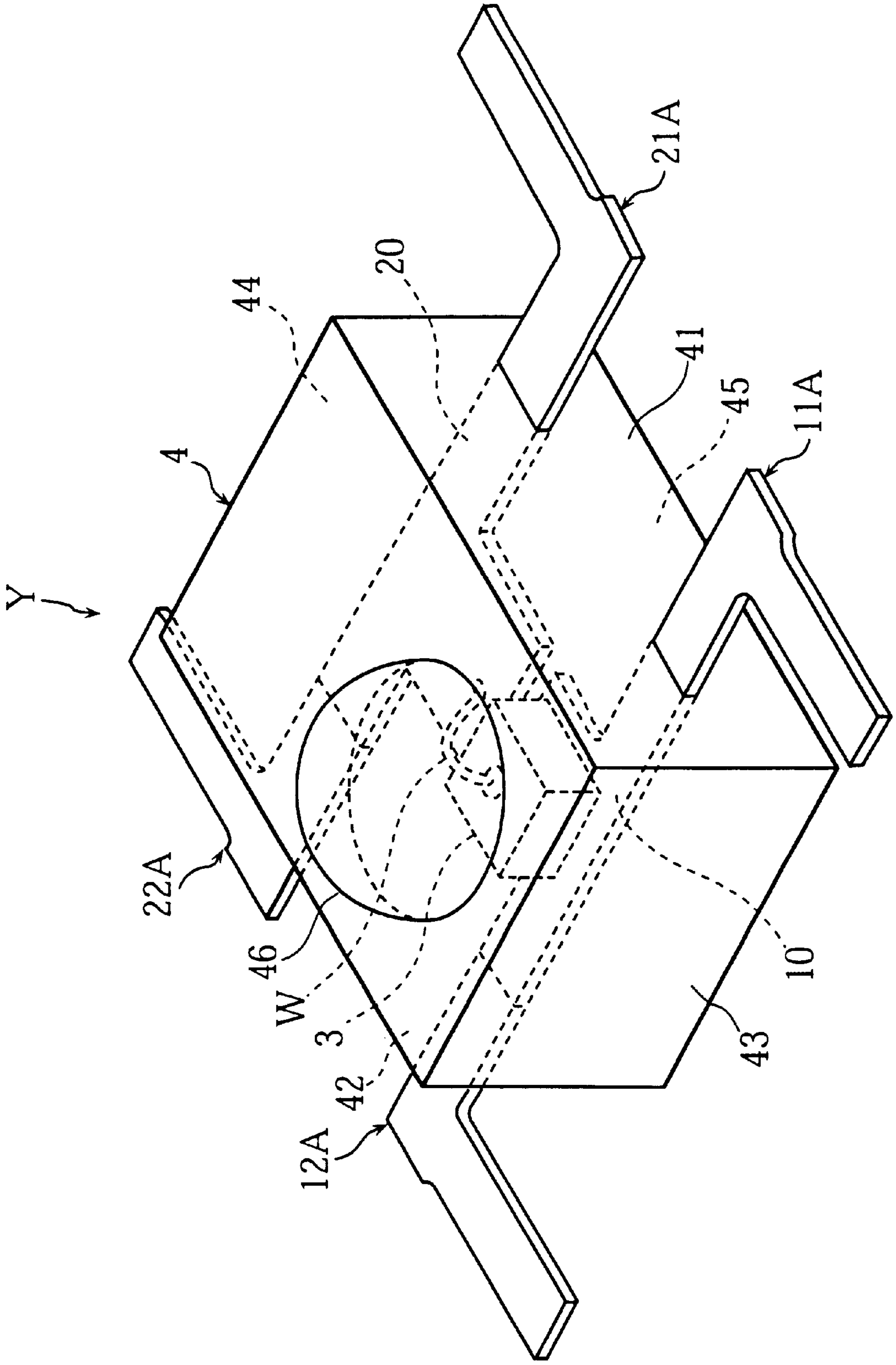
FIG. 8 is a perspective view showing a semi-finished product in which outer terminals of the semiconductor device are not bent.

After the resin package 4 is formed, the lead frame 6 is cut in predetermined lines (indicated by dashed lines in FIG. 5) to obtain a semi-finished semiconductor device Y as shown in FIG. 8. In the semi-finished semiconductor device Y, portions 11A, 12A, 21A, 22A respectively to become the outer terminals 11, 12, 21, 22 extend in a shape of L out of the first side surface 41 or the second side surface 42 of the resin package 4. These L-shaped portions 11A, 12A, 21A, 22A of the semi-finished product Y will be bent to provide the semiconductor device X1 as shown in FIG. 1.

Figure 9:
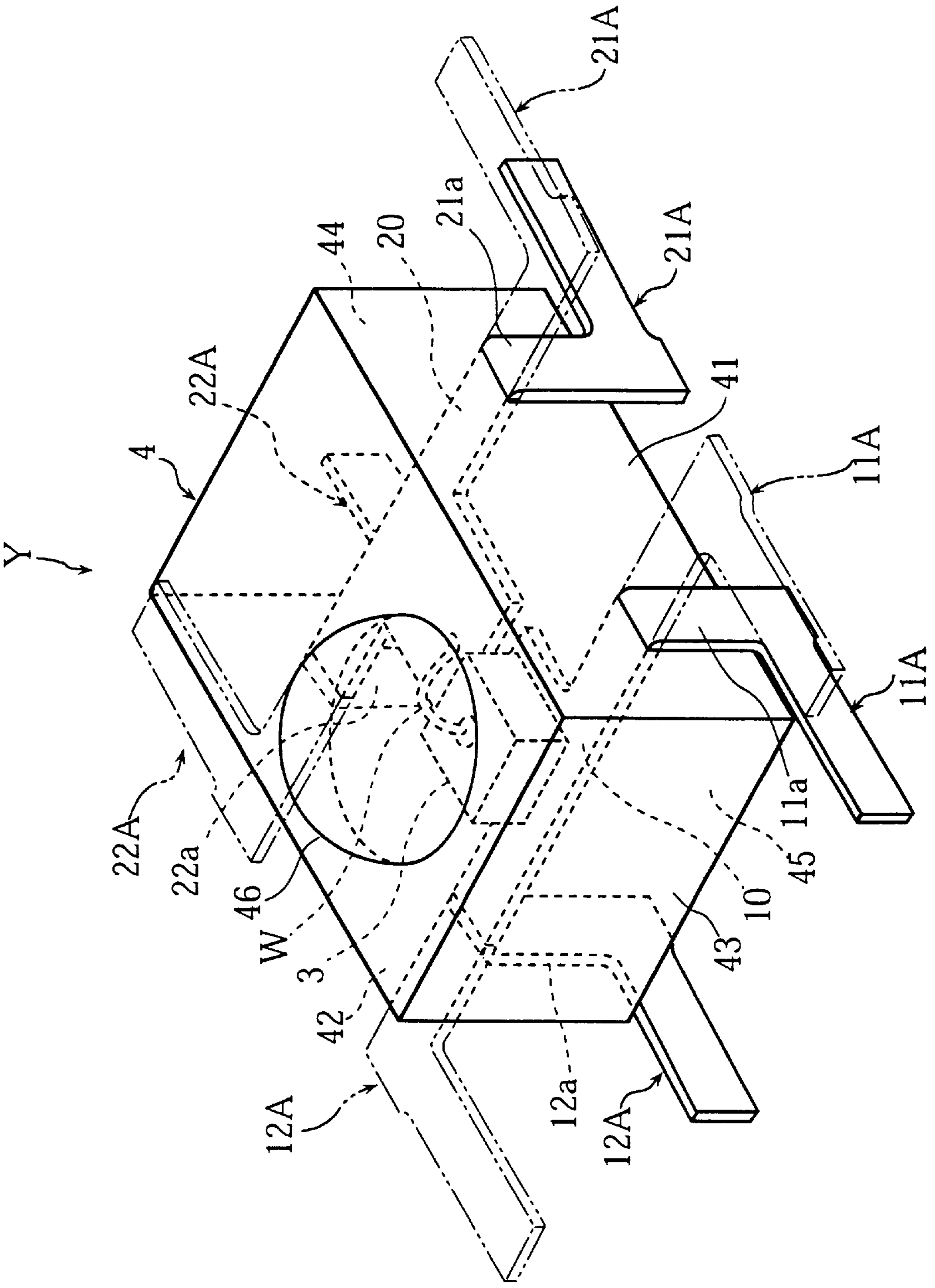
FIG. 9 is a perspective view showing a state in which portions to become the outer terminals of the semiconductor device in FIG. 8 are bent downward.

Specifically, first, as shown in FIG. 9, the L-shaped portions 11A, 12A, 21A, 22A are bent downward along the first and second surfaces 41, 42 of the resin package 4 to form the drop portion 11*a*, 12*a*, 21*a*, 22*a* of the outer terminals 11, 12, 21, 22 respectively.

Figure 10:
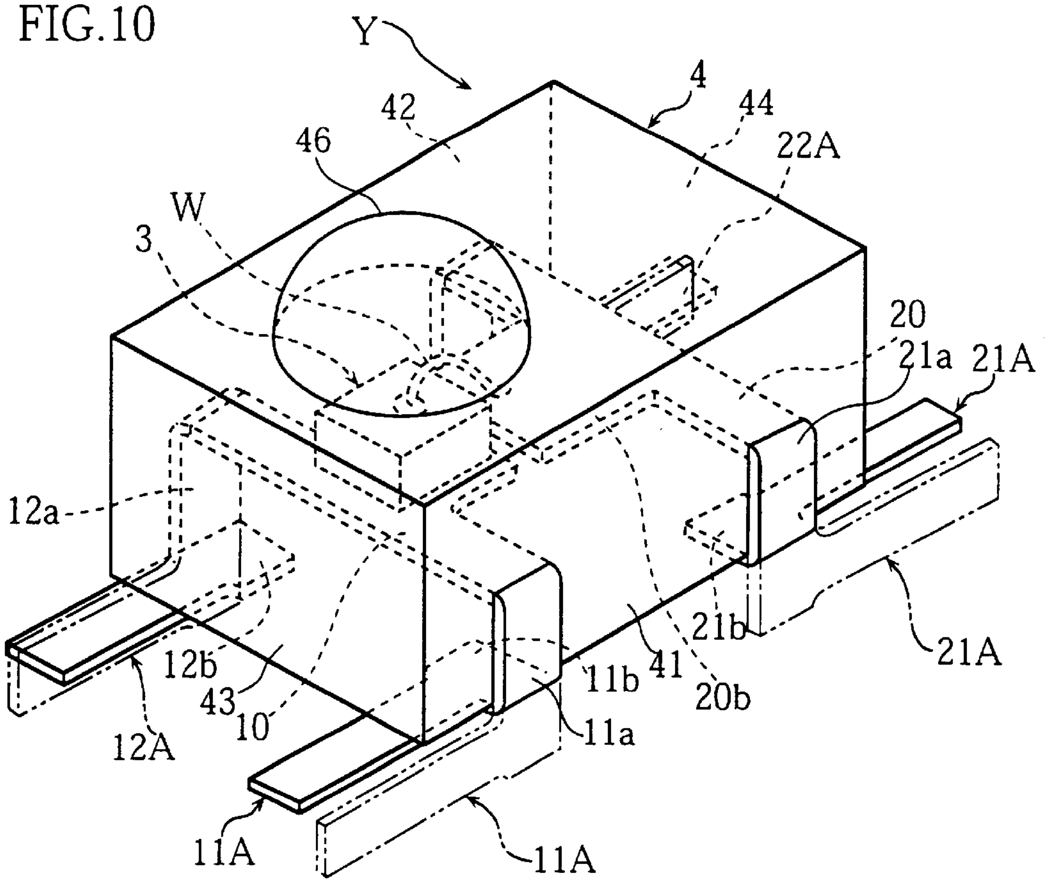
FIG. 10 a perspective view showing a state in which portions to become the outer terminals of the semiconductor device in FIG. 9 are bent once again.

Next, as shown in FIG. 10, the portions 11A, 12A, 21A, 22A are bent along the bottom surface 45 of the resin package 4, to form the bottom portions 11*b*, 12*b*, 21*b*, 22*b* of the outer terminals 11, 12, 21, 22. At this time, tip portions of the portions 11A, 12A, 21A, 22A extend out of the third and fourth surfaces 43, 44 of the resin package 4 respectively.

Figure 11:
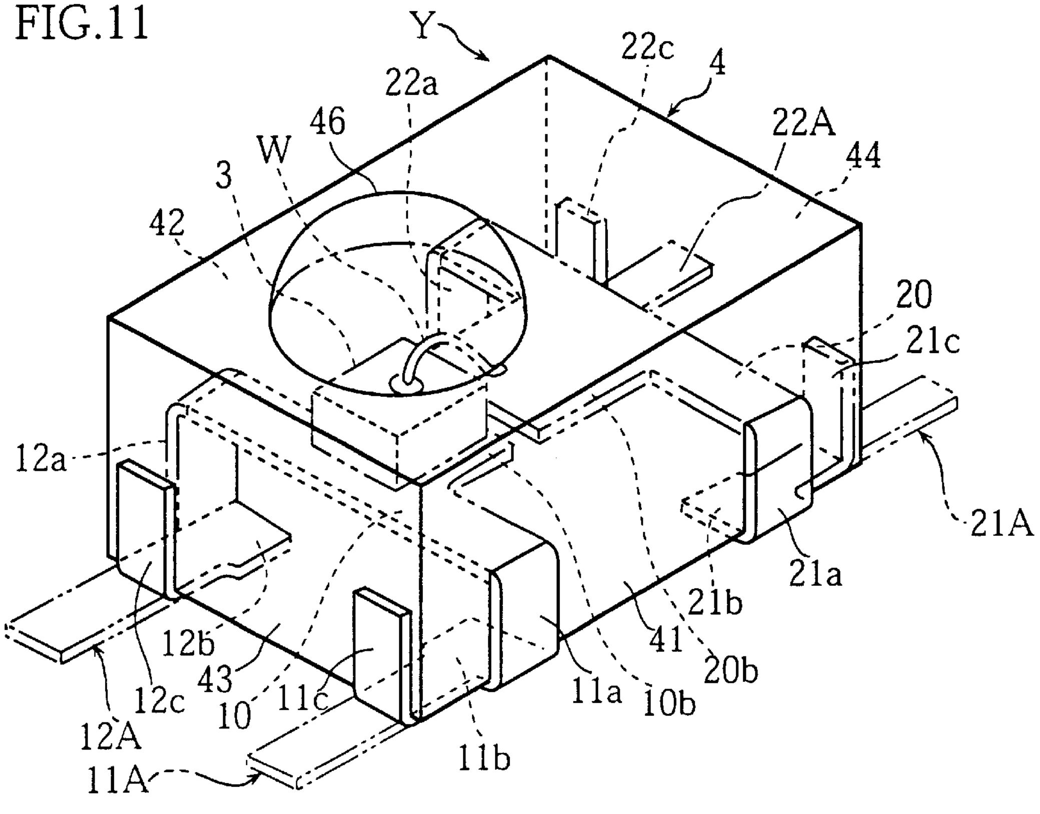
FIG. 11 a perspective view showing a state in which portions to become the outer terminals of the semiconductor device in FIG. 10 are bent once again.

Next, as shown in FIG. 11, the extending tip portions of the portions 11A, 12A, 21A, 22A are bent upward to extend along the third and fourth surfaces 43, 44 of the resin package 4 respectively, so that the tip portions of the portions 11A, 12A, 21A, 22A provide the riser portions 11*b*, 12*b*, 21*b*, 22*b* of the outer terminals 11, 12, 21, 22, and thus the semiconductor device X1 as shown in FIG. 1 is obtained.

Figure 12:
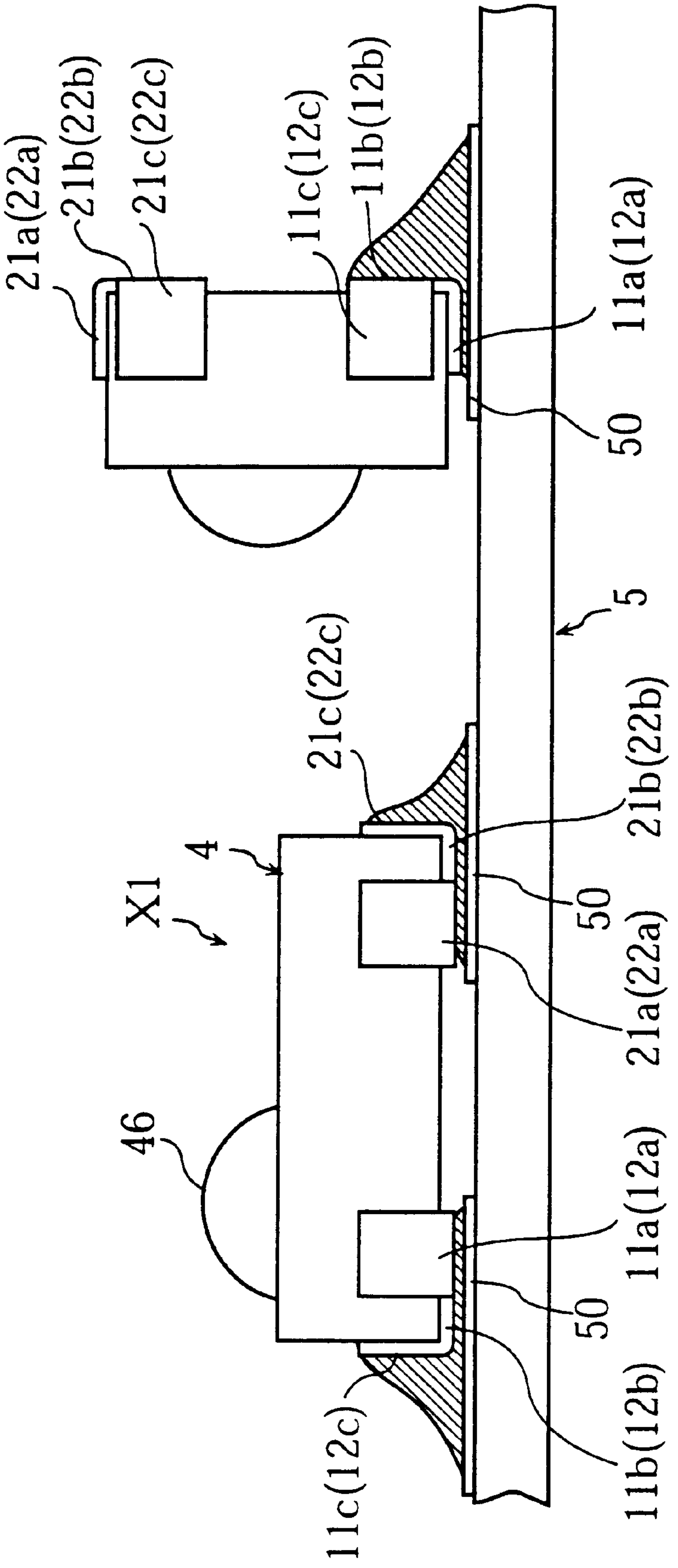
FIG. 12 a side view showing a state in which the semiconductor device in FIG. 1 is mounted to a circuit substrate.

The semiconductor device X1 manufactured as above is then mounted on a circuit substrate for example, for use. The semiconductor device X1 using the light emitting element as the semiconductor chip 3 can be used as a light source for various purposes such as an light emitting portion of an optical sensor, after mounted on the circuit board. Further, by selecting a suitable mounting surface (i.e. the first side surface 41, the second side surface 42 or the bottom surface 45 according to the present embodiment) in the semiconductor device X1, it becomes possible to select between a state in which the light is emitted vertically with respect of the object surface such as the circuit substrate and a state in which the light is emitted in parallel to the object surface. For example, if the upper surface 30 of the light emitting element 3 in the semiconductor device X1 serves as the light emitting surface, as shown in FIG. 12, the bottom surface 45 of the resin package 4 can be used as the mounting surface in order to emit the light vertically to the object surface 5. On the other hand, the first or the second surface 41 or 42 can be used as the mounting surface in order to emit the light in parallel to the object surface. If the light receiving element is used as the semiconductor chip 3, use may be made as a light receiving portion of an optical sensor for example.

In order to mount the semiconductor device X1, a solder re-flow method for example is suitably used. According to the solder re-flow method, first, cream solder is applied to surfaces of the outer terminals 11, 12, 21, 22 of the semiconductor device X1, or to surfaces of terminal pads 50 formed on the object surface 5 such as a circuit substrate. Then, the outer terminals 11, 12, 21, 22 are aligned with their corresponding terminal pads 50, and then the semiconductor device X1 is brought in a re-flow furnace for heating. In the re-flow furnace, the solder paste is re-melted under a temperature of about 200° C. When the solder paste is set again out of the re-flow furnace, the light emitting diode X is fixed on the circuit substrate 5.

As for placing of the semiconductor device X1 onto the circuit substrate 5, automatic placement can be achieved by using a mounting machine by preparing a plurality of semiconductor devices X1 in a suitable tray for example. As clearly shown in FIG. 2, since the convex lens portion 46 of the semiconductor device X1 is off the center and closer to the third side surface 43 of the resin package 4, a relatively large flat region is left on a side closer to the fourth side surface 44 of the upper surface of the resin package 4. Therefore, when the semiconductor device X1 is moved and/or placed by the mounting machine, using a conventional flat surface suction collet 90 can be used, without depending upon a special collet for sucking on a spherical surface.

When mounting the semiconductor device X1 onto the circuit substrate 5, the resin package 4 expands and shrinks in accordance with changes in thermal conditions. However, since the second bonding is made at the center portion of the resin package 4 as seen in plan view, stress acting on the second bonding is minimized. Specifically, an amount of displacement with respect to the terminal pad on the circuit substrate accompanying the thermal expansion or shrinkage of the resin package 4 at the time of heating and/or cooling is minimum at the center portion of the resin package 4 as seen in plan view. Therefore, even if the resin package 4 thermally expands and/or shrinks, there will be very little displacement in the position of the second bonding which is located generally in the center. Thus, the stress acting upon the second bonding is limited, making the wire W less susceptible to a failure at the place of second bonding when the semiconductor device X1 is mounted.

Next, a semiconductor device as a second embodiment of the present embodiment will be described with reference to FIGS. 13 to 15.

Figure 13:
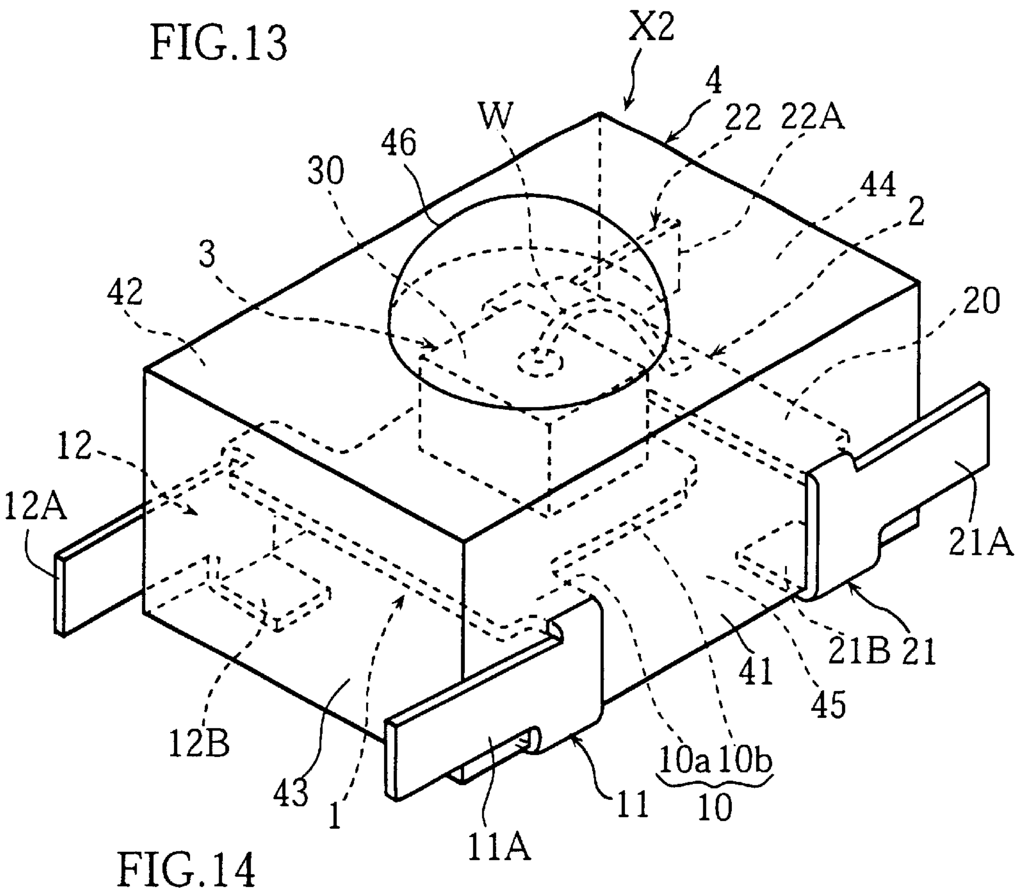
FIG. 13 is a perspective view of a semiconductor device as a second embodiment of the present invention.

As shown in FIG. 13, a semiconductor device X2 according to the present embodiment is similar to the semiconductor device X1 as the first embodiment described above, differing therefrom in the following aspects.

Specifically, first, the semiconductor chip 3 is placed generally at a widthwise and longitudinal center portion of the resin package 4, and the convex lens portion 46*b* in the resin package 4 is also placed generally at a widthwise and longitudinal center portion accordingly. Further, the inner terminal 20 of the second lead 2 does not have the tongue.

Next, shape of the outer terminals 11, 12, 21, 22 of respective first lead 1 and second lead 2 differ from those of the first embodiment. Specifically, according to the second embodiment, the outer terminals 11, 12, 21, 22 have two respective branch portions 11A, 11B, 12A, 12B, 21A, 21B, 22A, 22B. The branch portions 11A, 12A, 21A, 22A extending along the first or the second surface 41 or 42 of the resin package 4 are not bent but extended beyond the third or the fourth surface 43 or 44. On the other hand, the other branch portions 11B, 12B, 21B, 22B are bent along the first or the second surface 41 or 42, and the bottom surface 45 of the resin package 4.

According to the semiconductor device X2 arranged as above, an anode/cathode pair is formed in each of the first side surface 41 and the second side surface 42. Further, two of the anode/cathode pairs are formed on the bottom surface 45. Therefore, in the semiconductor device X2 according to the present embodiment, any of the first side surface 41, the second side surface 42 and the bottom surface 45 can be selected as the mounting surface to be used for the mounting on the object surface such as a circuit substrate.

Figure 14:
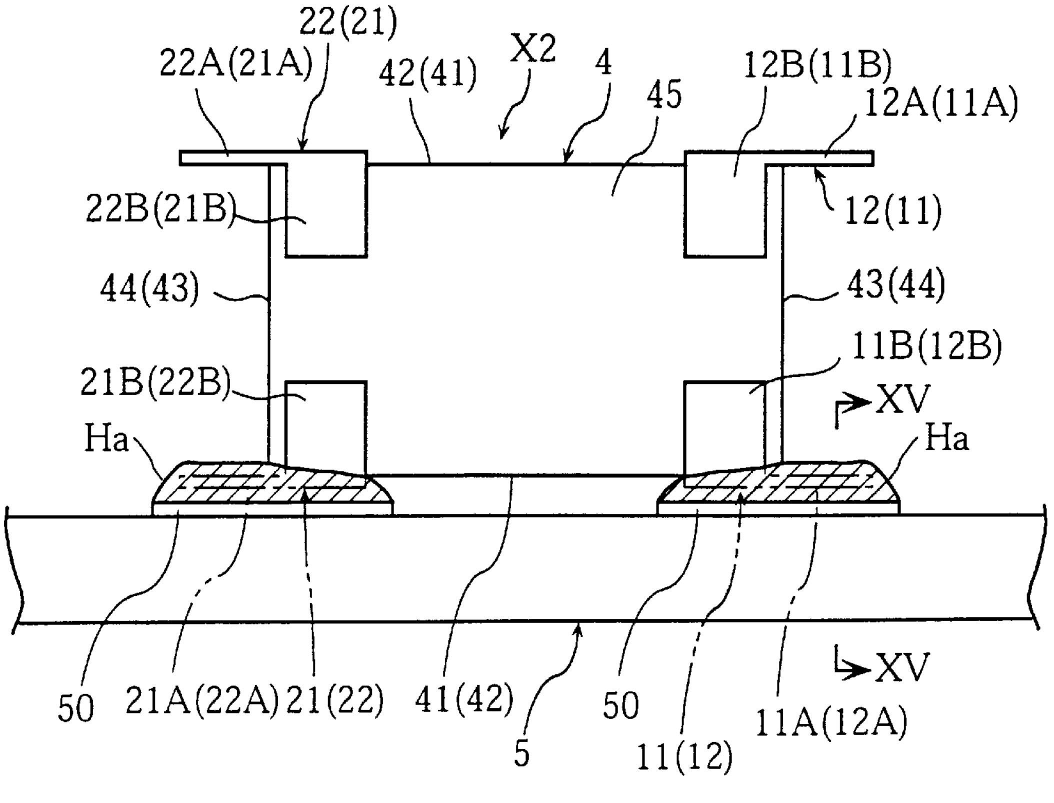
FIG. 14 is a side view showing a state in which the semiconductor device in FIG. 13 is mounted to an object surface (such as a circuit substrate).
Figure 15:
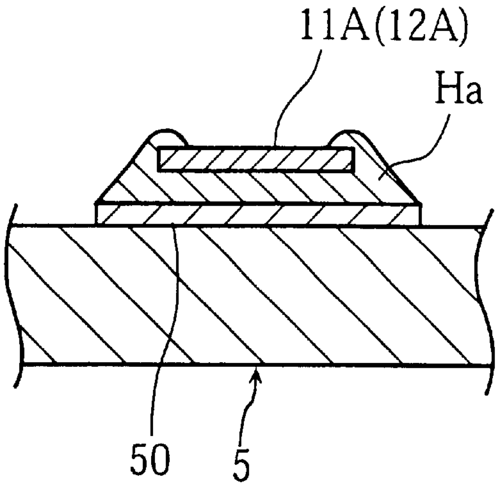
FIG. 15 is a sectional view taken in lines XV—XV in FIG. 14.

FIG. 14 shows a mounting example, in which the first or the second surface 41 or 42 are used as the mounting surface to mount on the object surface 5 (circuit substrate). In this case, because the branch portions 11A, 12A, 21A, 22A extend beyond the third or the fourth surface 43 or 44 respectively, an area of bonding can be increased accordingly. As a result, it becomes possible to mount the semiconductor device X2 stably on the object surface 5.

When mounting the semiconductor device X2 on the object surface 5, the solder re-flow method as has been described earlier is utilized, in which the cream solder applied to each of the outer terminals 11, 12, 21, 22 is re-melted at the time of the mounting. For this reason, with the present arrangement in which the branch portions 11A, 12A, 21A, 22A of the outer terminals 11, 12, 21, 22 extend beyond the third or the fourth surfaces 43 or 44 of the resin package 4, molten solder Ha rides on upper surfaces of the branch portions as shown in FIG. 15. The molten solder Ha sets in this state, completing the mounting of the semiconductor device X2 on the object surface 5 such as a circuit substrate. Therefore a strong bonding can be achieved.

Further, according to the semiconductor device X2 with the above described arrangement, as shown in FIG. 14, the branch portions 11B, 12B, 21B, 22B of the outer terminals 11, 12, 21, 22 are disposed in a scattered manner at four corners of the bottom surface 45. Therefore, if the bottom surface 45 is used as the mounting surface, there are four bonding portions to fix onto the object surface 5, making possible not only to mount the semiconductor device X2 more stably but also to mount the semiconductor device X2 accurately by means of self aligning effect achieved by tensions acting in four directions when the solder is re-flown.

Figure 16:
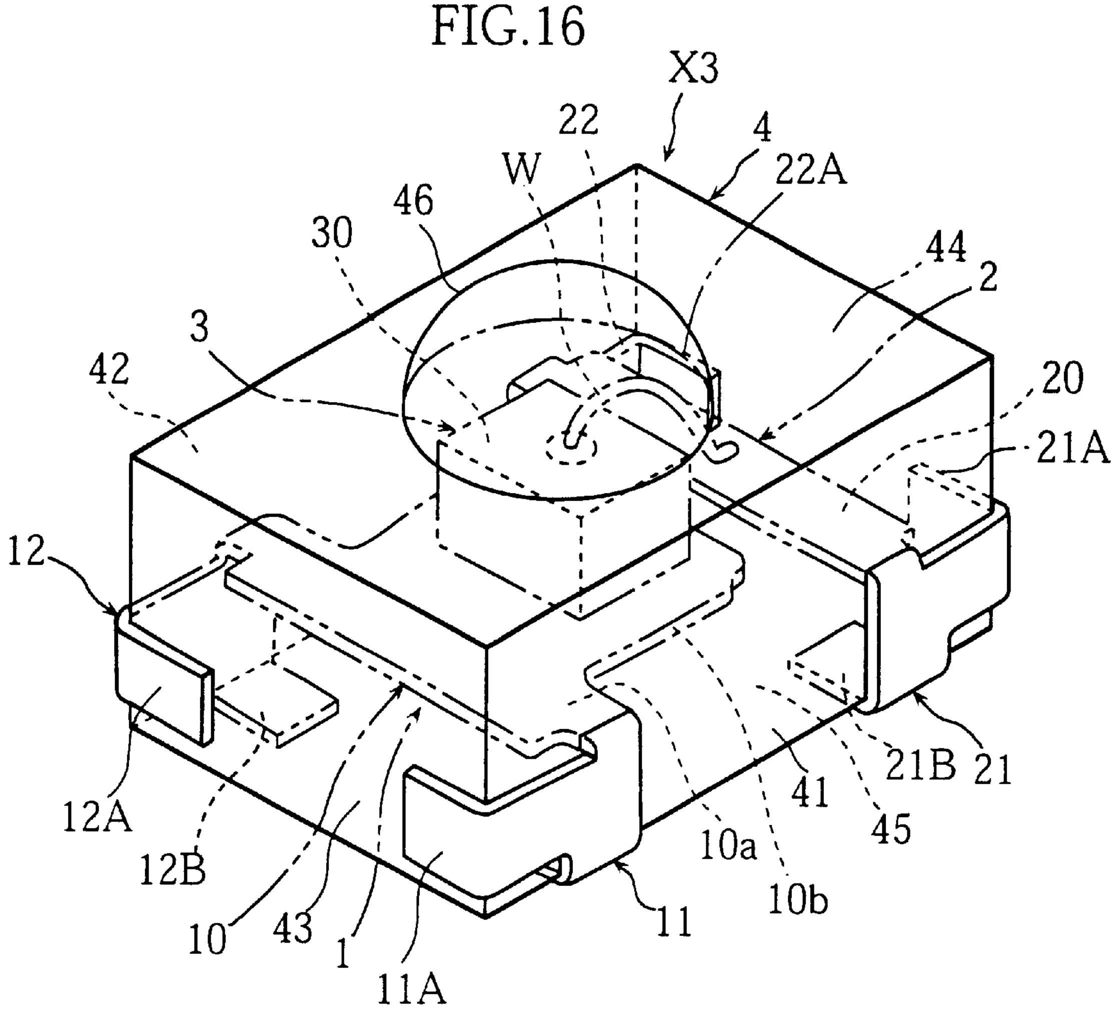
FIG. 16 is a perspective view of a semiconductor device as a third embodiment of the present invention.

FIG. 16 shows a semiconductor device X3 as a third embodiment of the present invention. The semiconductor device X3 according to the present embodiment is similar to the semiconductor device X2 as the second embodiment, differing from the second embodiment in that the branch portions 11A, 12A, 21A, 22A of the outer terminals 11, 12, 21, 22 are bent along the first or the second surface 41 or 42, and an adjacent side surface (i.e. the third or the fourth surface 43 or 44) respectively. The semiconductor device X3 with the above arrangement offers an advantage that the four corners of the bottom surface 45 of the resin package 4 are surrounded and thereby reinforced by the outer terminals 11, 12, 21, 22.

Figure 17:
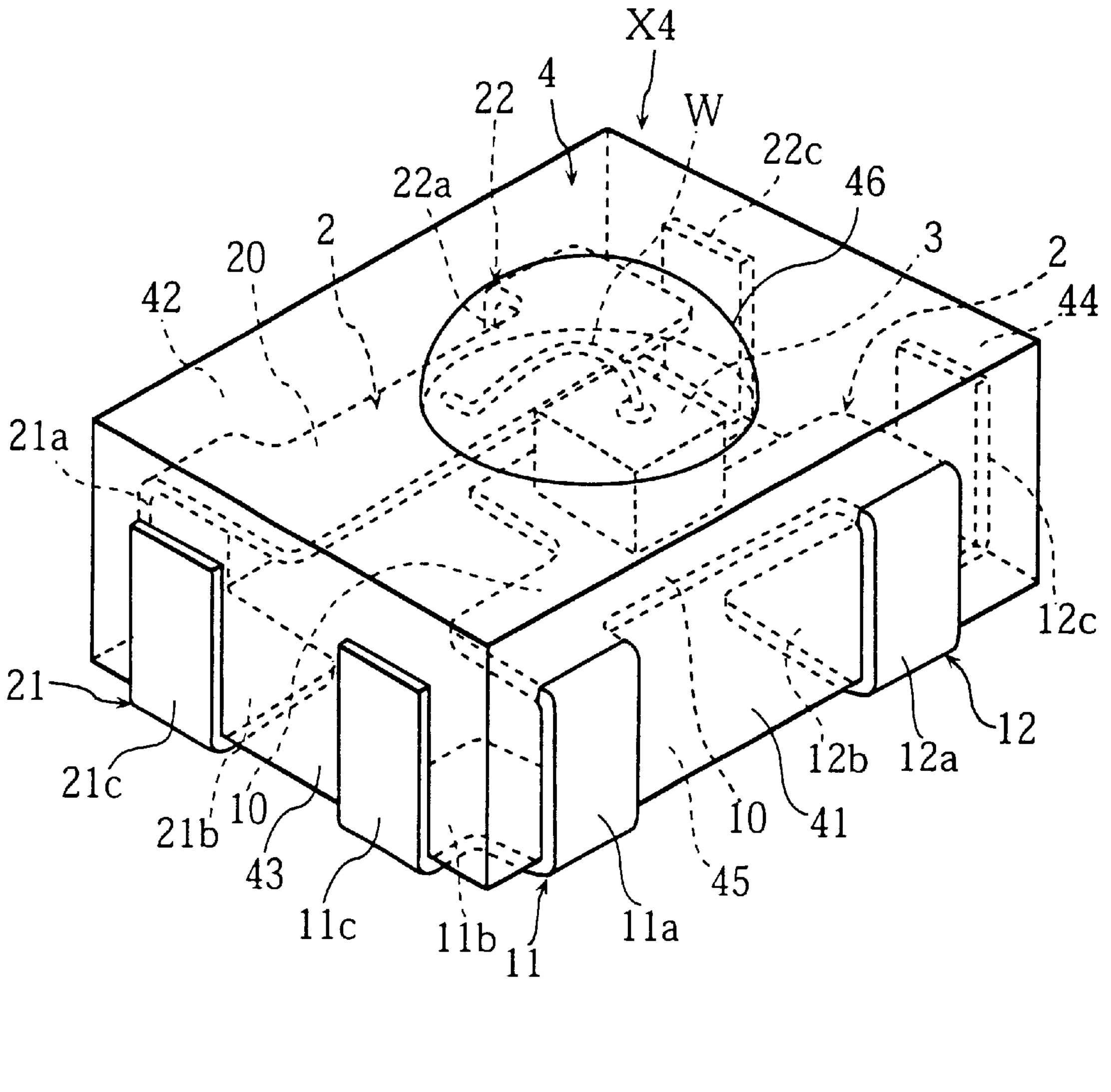
FIG. 17 is a perspective view of a semiconductor device as a fourth embodiment of the present invention.
Figure 18:
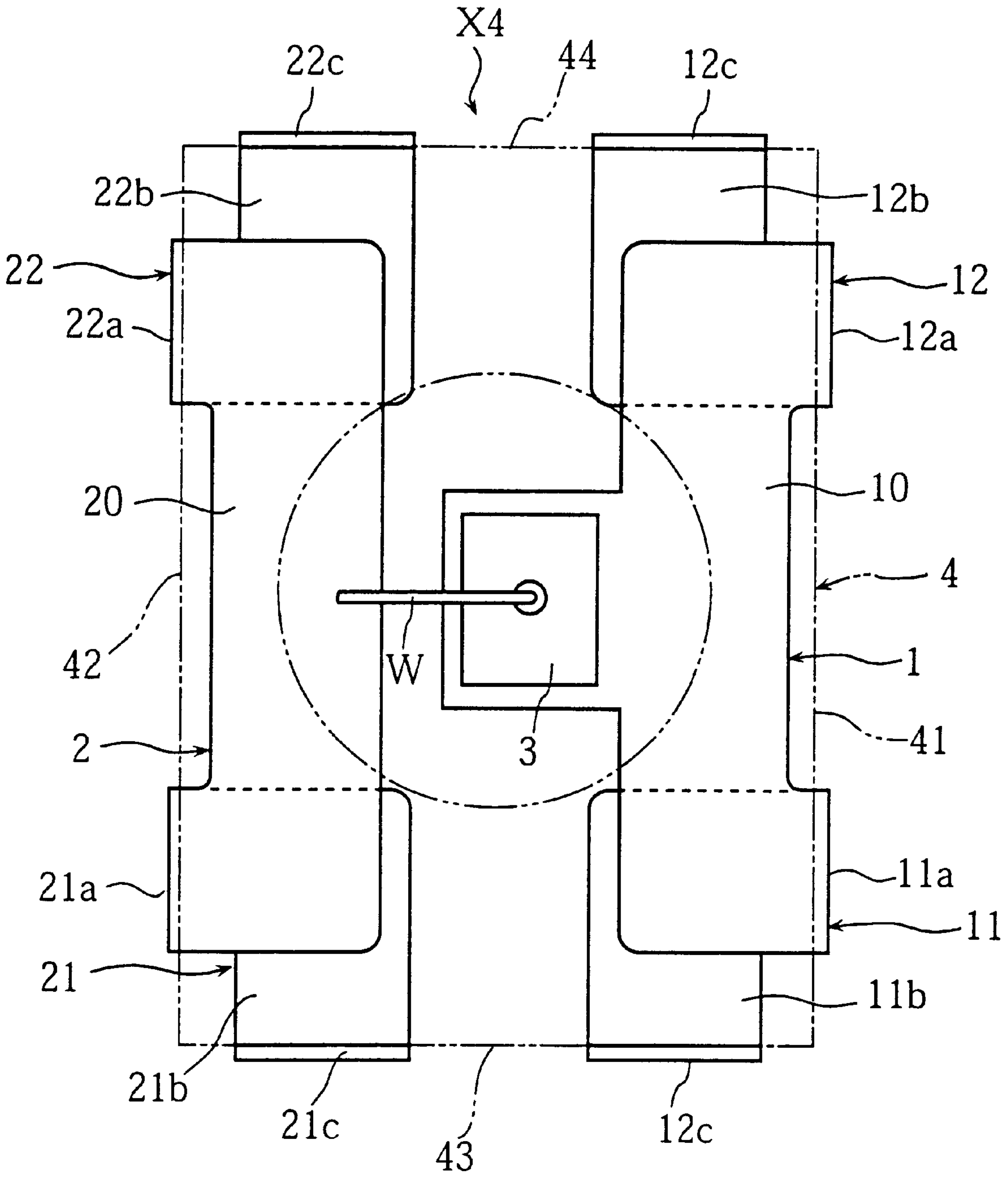
FIG. 18 is a transparent plan view of the semiconductor device shown in FIG. 17.

FIGS. 17 and 18 show a semiconductor device as a fourth embodiment of the present invention. The semiconductor device X4 according to the present embodiment differs from the semiconductor device X1 according to the first embodiment in that both of the outer terminals 11, 12 of the first lead 1 are formed on the first side surface 41 while both of the outer terminals 21, 22 of the second lead 2 are formed on the second side surface 42 of the resin package 4.

The outer terminals 11, 12 of the first lead 1 are bent so as to form respective drop portions 11*a*, 12*a* extending along the first side surface 41 of the resin package 4, the bottom portions 11*b*, 12*b* extending from the respective drop portions 11*b*, 12*b* along the bottom surface 45 of the resin package 4, and the riser portions 11*c* 12*c* extending from the bottom portions 11*b*, 12*b* along the third or the fourth surface 43 or 44. Likewise, the outer terminals 21, 22 of the second lead 2 are bent so as to form the drop portions 21*a*, 22*a* extending along the second side surface 42 of the resin package 4, the bottom portions 21*b*, 22*b* extending from the respective drop portions 21*a*, 22*a* along the bottom surface 45 of the resin package 4, and the riser portions 21*c* 22*c* extending from the bottom portions 21*b*, 22*b* along the third or the fourth surface 43 or 44 respectively.

With the above arrangement, two anode/cathode pairs are formed on the bottom surface 45, and one anode/cathode pair is formed in each of the third side surface 43 and the fourth side surface 44 of the resin package 4. Therefore, in the semiconductor device X4 according to the present embodiment, any of the bottom surface 45, the third side surface 43 and the fourth side surface 44 can be selected as the mounting surface. Further, the four corners of the bottom surface 45 of the resin package 4 are surrounded and thereby reinforced by the outer terminals 11, 12, 21, 22 respectively.

Figure 19:
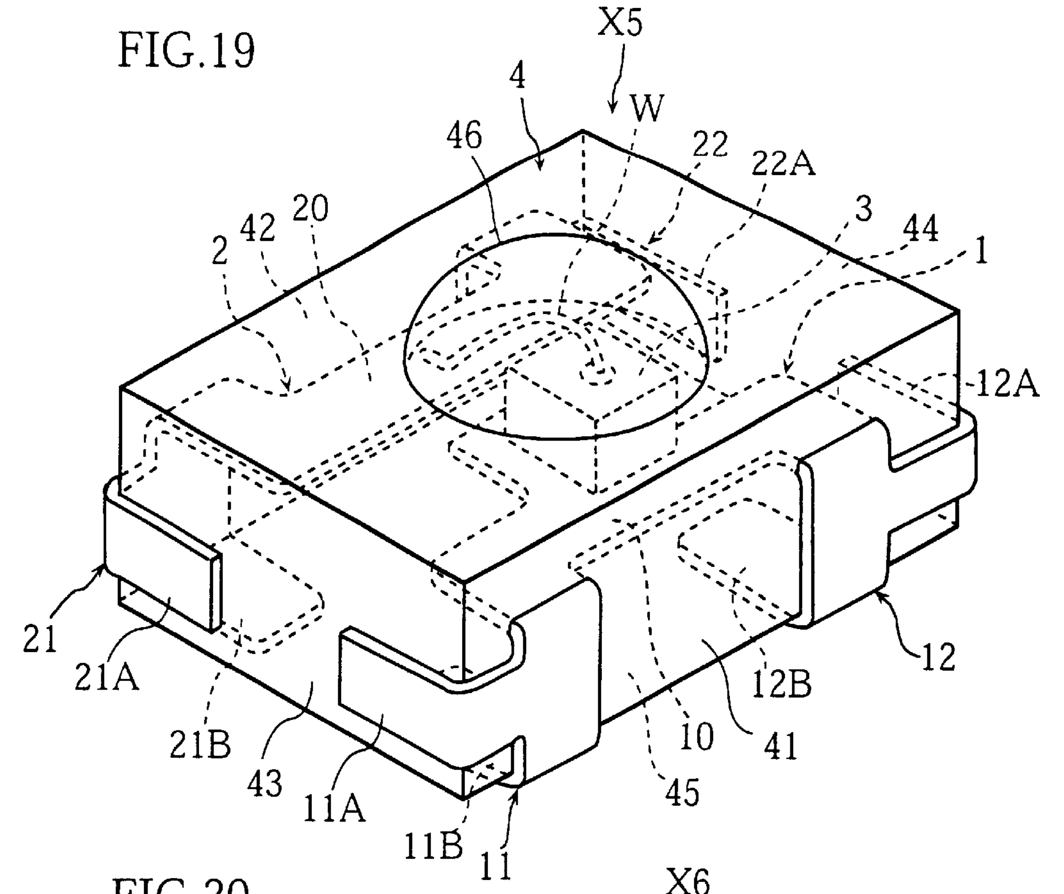
FIG. 19 is a perspective view of a semiconductor device as a fifth embodiment of the present invention.

FIG. 19 shows a semiconductor device X5 as a fifth embodiment of the present invention. According to the present embodiment, as in the fourth embodiment (FIGS. 17 and 18), both of the outer terminals 11, 12 of the first lead are formed on the first side surface 41 and both of the outer terminals 21, 22 of the second lead 2 are formed on the second side surface 42 of the resin package 4. Further, as in the third embodiment (FIG. 16), the outer terminals 11, 12, 21, 22 have two branch portions 11A, 11B, 12A, 12B, 21A, 21B, 22A, 22B respectively. The branch portions 11A, 12A, 21A, 22A are bent to extend along the first or the second surface 41 or 42 and along the third or the fourth surface 43 or 44 of the resin package 4. Further, the branch portions 11B, 12B, 21B, 22B of the outer terminals 11, 12, 21, 22 are bent to extend along the first or the second surface 41 or 42 and along the bottom surface 45 of the resin package 4.

According to the semiconductor device X5 arranged as above, an anode/cathode pair is formed in each of the third side surface 43 and the fourth side surface 44. Further, two anode/cathode pairs are formed on the bottom surface 45. Therefore, in the semiconductor device X5 according to the present embodiment, any of the third side surface 43, the fourth side surface 44 and the bottom surface 45 can be selected as the mounting surface to be used for the mounting on the object surface such as a circuit substrate.

Figure 20:
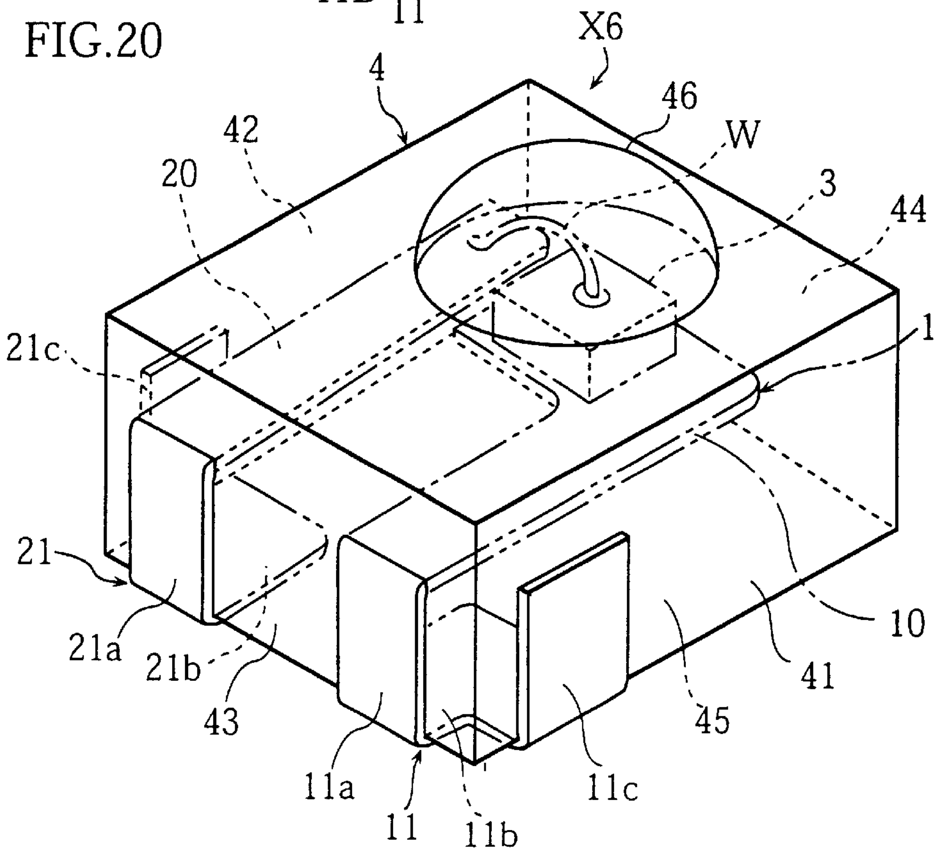
FIG. 20 is a perspective view of a semiconductor device as a sixth embodiment of the present invention.
Figure 21:
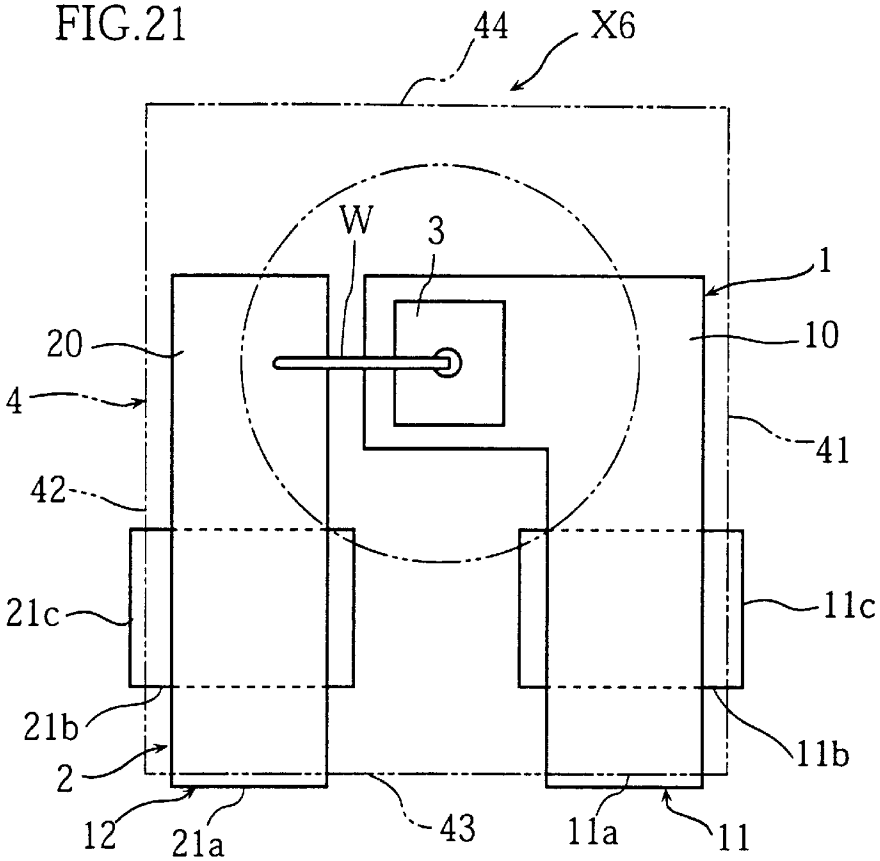
FIG. 21 is a transparent plan view of the semiconductor device shown in FIG. 20.

FIGS. 20 and 21 show a semiconductor device X6 as a sixth embodiment of the present invention. The present embodiment differs from the semiconductor devices X1 to X5 according to the first to fifth embodiments in that the first and the second leads 1, 2 have single outer terminals 11, 12 respectively.

The outer terminal 11 of the first lead 1 is bent to form the drop portion 11*a* extending from the inner terminal 10 of the lead along the third side surface 43 of the resin package 4, the bottom portion 11*b* extending from the drop portion 11*a* along the bottom surface 45 of the resin package 4, and the riser portion 11*c* extending from the bottom portion 11*b* along the first side surface 41 of the resin package 4. Likewise, the outer terminal 21 of the second lead 2 is bent to form the drop portion 21*a* extending from the inner terminal 20 of the lead along the third side surface 43 of the resin package 4, the bottom portion 21*b* extending from the drop portion 21*a* along the bottom surface 45 of the resin package 4, and the riser portion 21*c* extending from the bottom portion 21*b* along the second side surface 42 of the resin package 4.

According to the semiconductor device X6 with the above arrangement, an anode/cathode pair is formed in each of the third side surface 43 and the bottom surface 45 of the resin package 4. Therefore, either of the third side surface 43 and the bottom surface 45 can be selected as the mounting surface.

Figure 22:
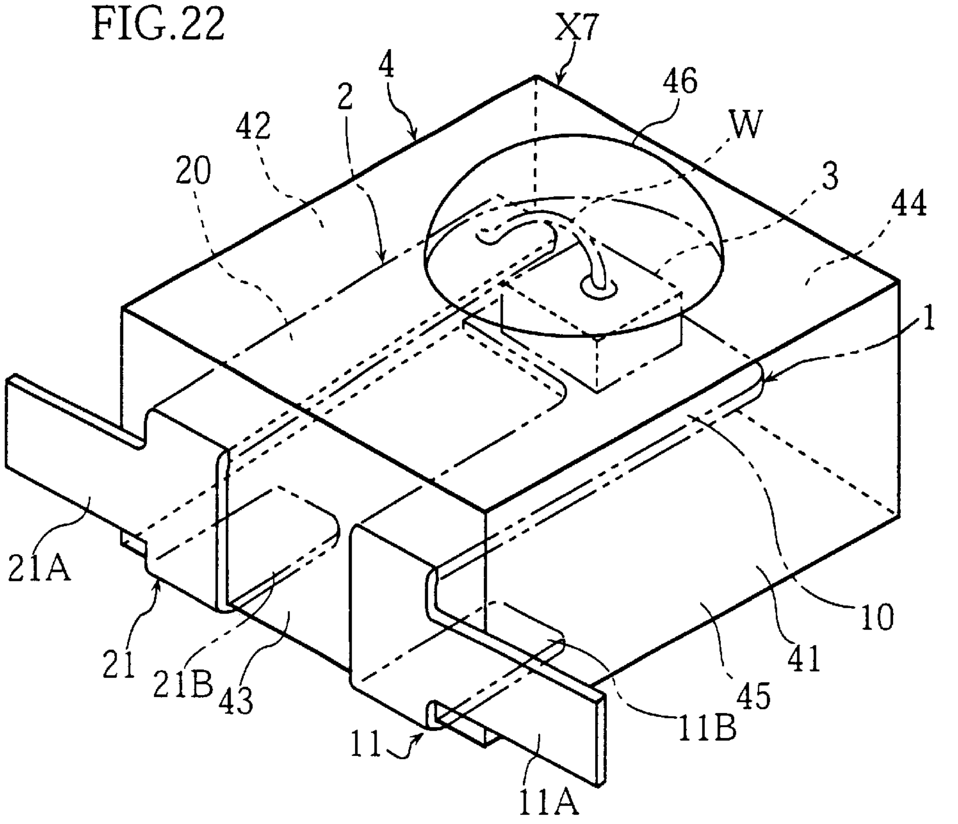
FIG. 22 is a perspective view of a semiconductor device as a seventh embodiment of the present invention.

FIG. 22 shows a semiconductor device X7 as a seventh embodiment of the present invention. In the semiconductor device X7 according to the present embodiment, the first and the second leads 1, 2 have single outer terminals 11, 12 respectively. The outer terminals 11, 21 have two branch portions 11A, 11B, 12A, 12B respectively. The branch portions 11A, 21A of the outer terminals 11, 21 are not bent but extending along the third side surface 43 of the resin package 4 beyond the first and the second surfaces 41, 42 respectively. On the other hand, the other branch portions 11B, 21B are bent along the third side surface 43 and the bottom surface 45 of the resin package 4.

According to the semiconductor device X7 with the above arrangement, an anode/cathode pair is formed in each of the third side surface 43 and the bottom surface 45 of the resin package 4. Therefore, either of the third side surface 43 and the bottom surface 45 can be selected as the mounting surface for mounting on the object surface such as a circuit substrate.

Figure 23:
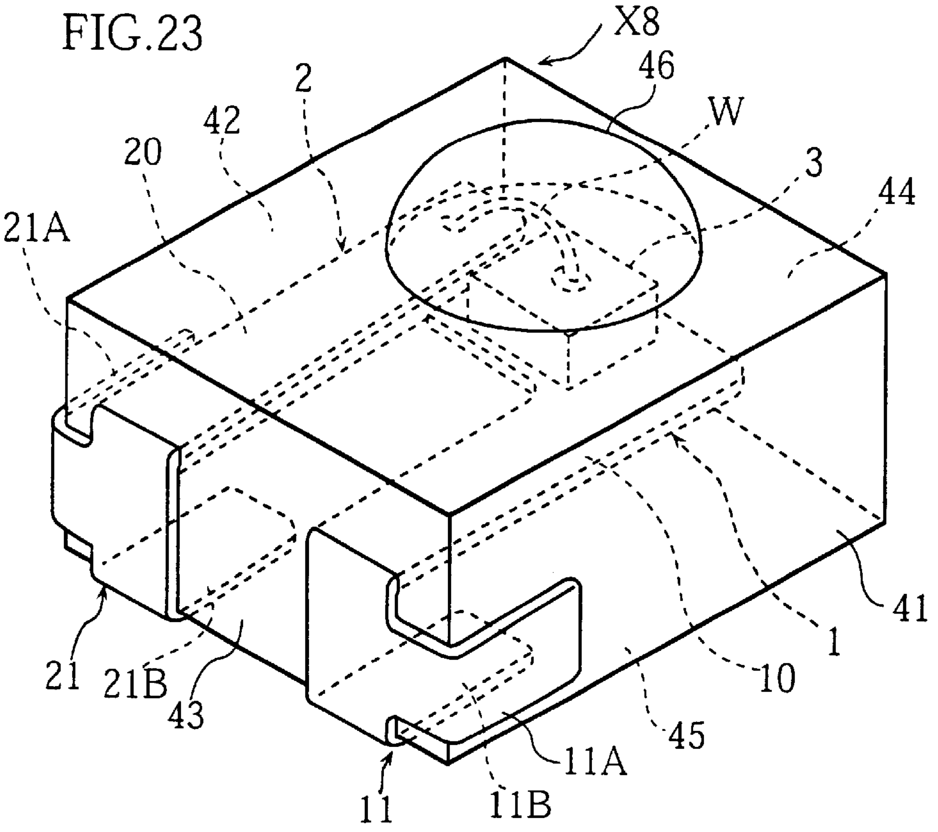
FIG. 23 is a perspective view of a variation of the semiconductor device shown in FIG. 21.

FIG. 23 shows a semiconductor device X8 as an eighth embodiment of the present invention. The semiconductor device X8 according to the present embodiment is similar to the semiconductor device X7 according to the seventh embodiment, but differs from the seventh embodiment in that respective branch portions 11A, 21A of the outer terminals 11, 21 are bent along the third side surface 43 and either of the first and the second surfaces 41, 42. The semiconductor device X8 with the above arrangement offers an advantage that two corners of the bottom surface 45 of the resin package 4 are surrounded and thereby reinforced by the outer terminals 11, 21.

Figure 24:
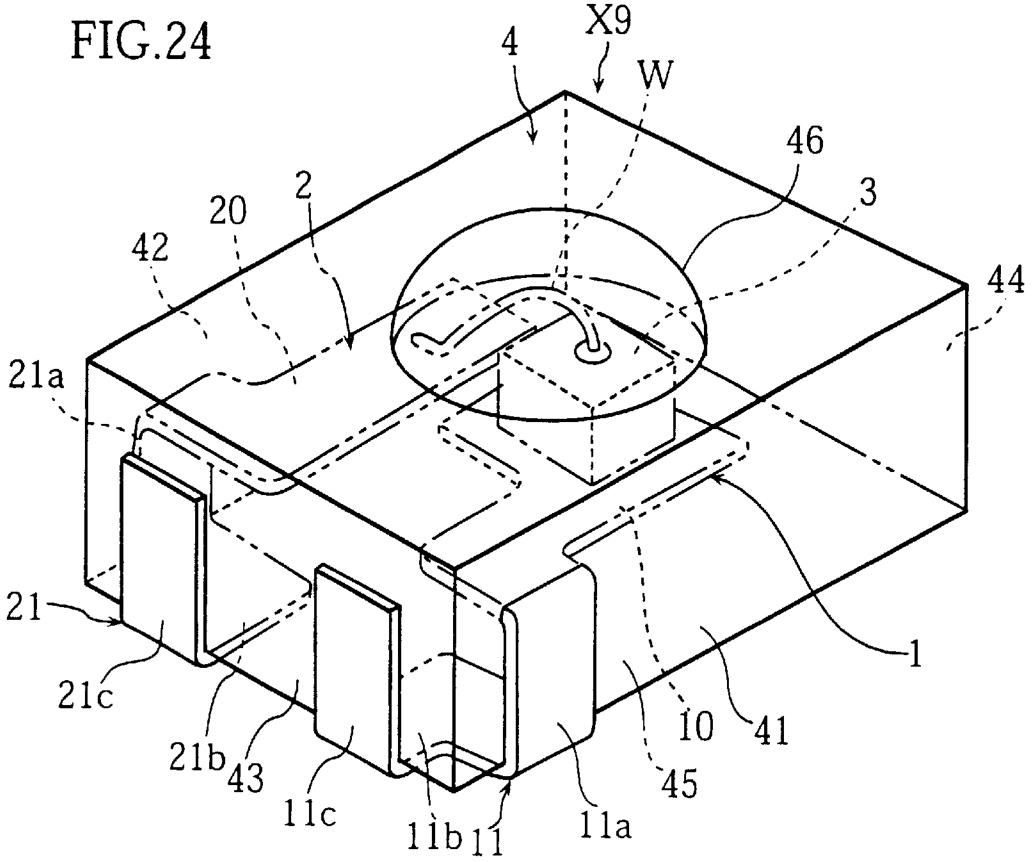
FIG. 24 is a perspective view of a semiconductor device as an eighth embodiment of the present invention.

FIG. 24 shows a semiconductor device X9 as a ninth embodiment of the present invention. The present embodiment is the same as the sixth embodiment in that the first and the second leads 1, 2 have single outer terminals 11, 12 respectively, but there are differences in the shape of the outer terminals. Specifically, the outer terminals 11 of the first lead 1 is bent to form the drop portion 11*a* extending from the inner terminal 10 of the lead along the first side surface 41 of the resin package 4, the bottom portion 11*b* extending from the drop portion 11*a* along the bottom surface 45 of the resin package 4, and the riser portion 11*c* extending from the bottom portion 11*b* along the third side surface 43 of the resin package 4. Likewise, the outer terminal 21 of the second lead 2 is bent to form the drop portion 21*a* extending from the inner terminal 20 of the lead along the second side surface 42 of the resin package 4, the bottom portion 21*b* extending from the drop portion 21*a* along the bottom surface 45 of the resin package 4, and the riser portion 21*c* extending from the bottom portion 21*b* along the third side surface 43 of the resin package 4.

According to the semiconductor device X9 arranged as above, an anode/cathode pair is formed in each of the third side surface 43 and the bottom surface 45 of the resin package 4. Therefore, either of the third side surface 43 and the bottom surface 45 can be selected as the mounting surface.

Figure 25:
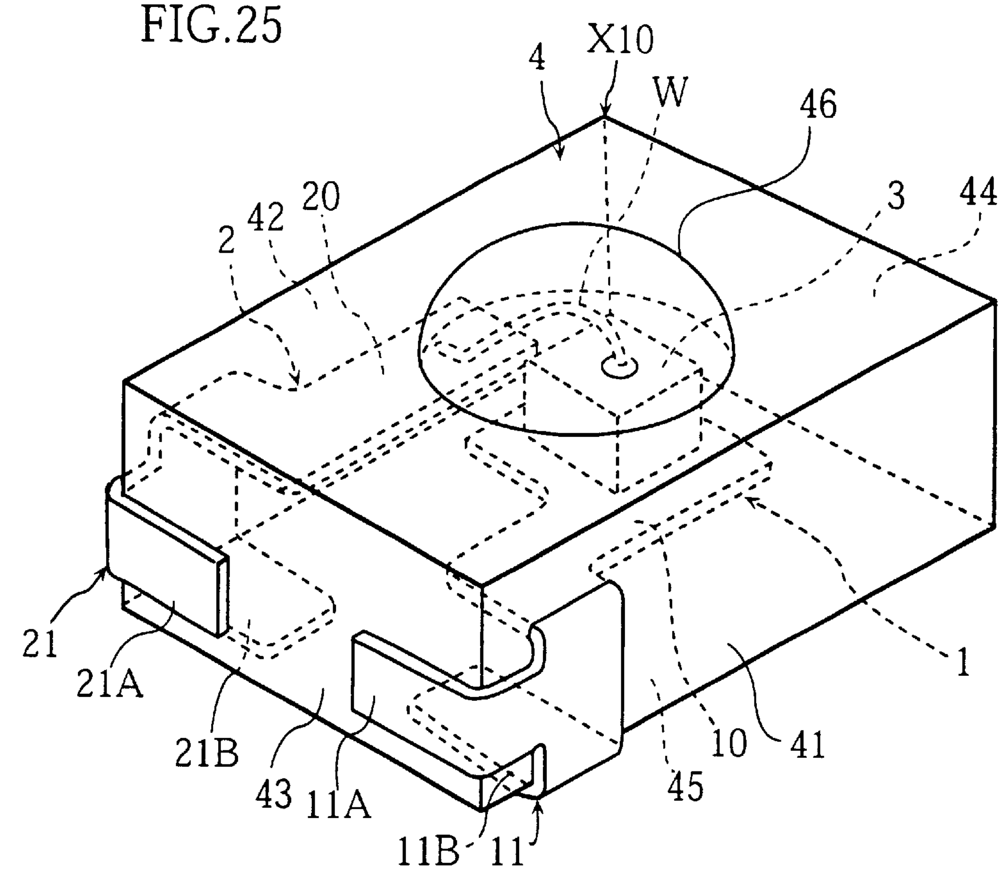
FIG. 25 is a perspective view of a semiconductor device as a ninth embodiment of the present invention.

FIG. 25 shows a semiconductor device X10 as a tenth embodiment of the present invention. According to the present embodiment, as in the eighth embodiment (FIG. 23), the first and the second leads 1, 2 have single outer terminals 11, 12 respectively, and the outer terminals 11, 21 have two branch portions 11A, 11B, 12A, 12*b*, 21A, 21B, 22A, 22B respectively. The branch portion 11A of the outer terminals 11 of the first lead 1 is bent along the first side surface 41 and the third side surface 43 of the resin package 4, whereas the other branch portion 11B is bent along the first side surface 41 and the bottom surface 45 of the resin package 4. On the other hand, the branch portion 21A of the outer terminals 21 of the second lead 2 is bent along the second side surface 42 and the third side surface 43 of the resin package 4, whereas the other branch portion 21B is bent along the second side surface 42 and the bottom surface 45 of the resin package 4.

According to the semiconductor device X10 arranged as above, again, an anode/cathode pair is formed in each of the third side surface 43 and the bottom surface 45 of the resin package 4. Therefore, either of the third side surface 43 and the bottom surface 45 can be selected as the mounting surface.

Figure 26:
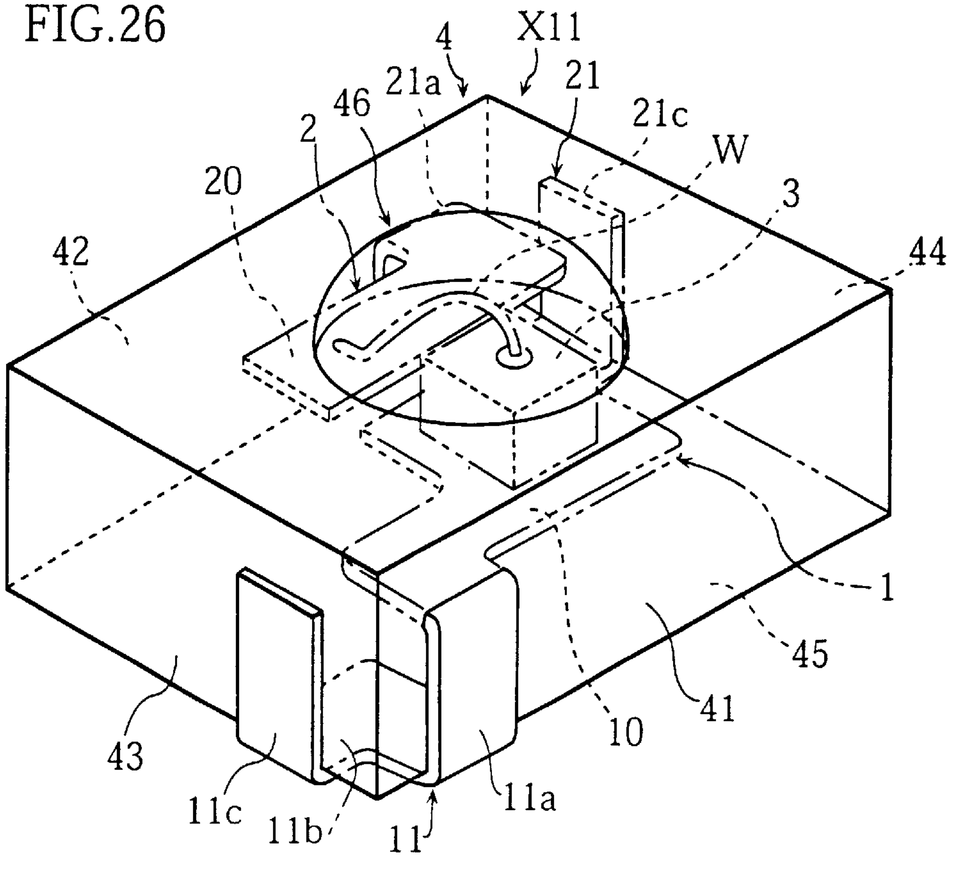
FIG. 26 is a perspective view of a semiconductor device as a tenth embodiment of the present invention.
Figure 27:
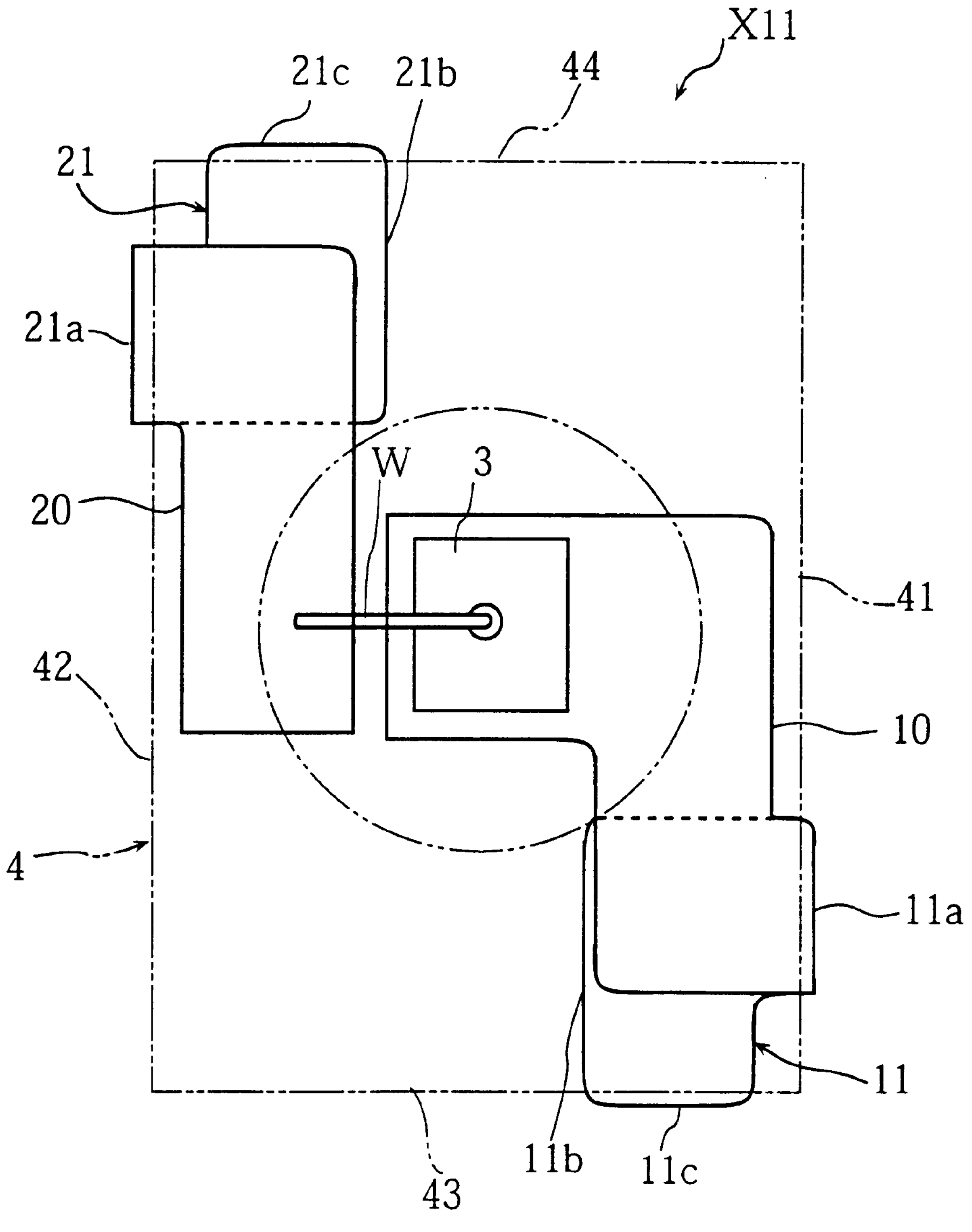
FIG. 27 is a transparent plan view of the semiconductor device shown in FIG. 26.

FIGS. 26 and 27 show a semiconductor device X11 as an eleventh embodiment of the present invention. In the present embodiment again, the first and the second leads 1, 2 have single outer terminals 11, 12 respectively, but the outer terminals 11, 12 are disposed apart from each other diagonally of the resin package 4. The outer terminal 11 of the first lead 1 is bent to form the drop portion 11*a* extending from the inner terminal 10 of the lead along the first side surface 41 of the resin package 4, the bottom portion 11*b* extending from the drop portion 11*a* along the bottom surface 45 of the resin package 4, and the riser portion 11*c* extending from the bottom portion 11*b* along the third side surface 43 of the resin package 4. Likewise, the outer terminal 21 of the second lead 2 is bent to form the drop portion 21*a* extending from the inner terminal 20 of the lead along the second side surface 42 of the resin package 4, the bottom portion 21*b* extending from the drop portion 21*a* along the bottom surface 45 of the resin package 4, and the riser portion 21*c* extending from the bottom portion 21*b* along the fourth surface 43 of the resin package 4.

Figure 28:
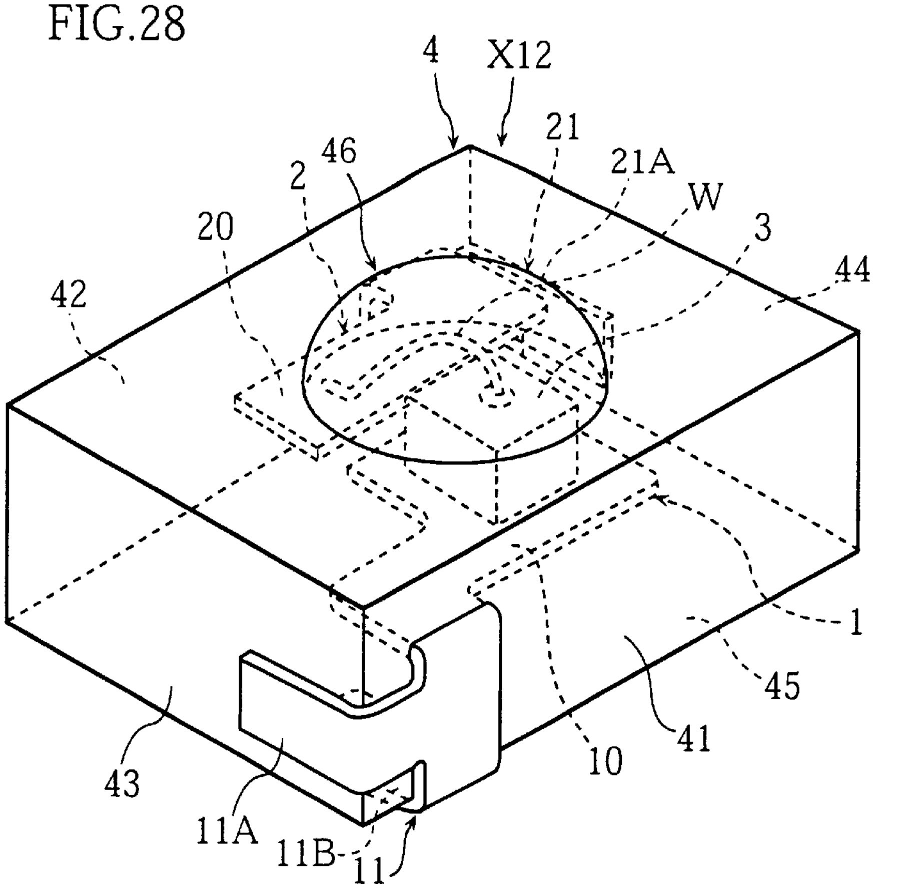
FIG. 28 is a perspective view of a semiconductor device as an eleventh embodiment of the present invention.

FIG. 28 shows a semiconductor device X12 as a twelfth embodiment of the present invention. In the present embodiment again, the first and the second leads 1, 2 have single outer terminals 11, 12 respectively. Further, as in the eleventh embodiment, the outer terminals 11, 12 are disposed apart from each other diagonally of the resin package 4. The branch portion 11A of the outer terminals 11 of the first lead 1 is bent along the first side surface 41 and the third side surface 43 of the resin package 4, whereas the other branch portion 11B is bent along the first side surface 41 and the bottom surface 45 of the resin package 4. On the other hand, the branch portion 21A of the outer terminal 21 of the second lead 2 is bent along the second side surface 42 and the fourth surface 44 of the resin package 4, whereas the other branch portion 21B is bent along the second side surface 42 and the bottom surface 45 of the resin package 4.

A variety of semiconductor devices within the scope of the present invention being thus far described, it is obvious that the scope of the present invention is not limited by these embodiments described here above.

What is claimed is:

1. A semiconductor device comprising:

a semiconductor chip;

a first lead connected to an electrode of the semiconductor chip;

a second lead connected to another electrode of the semiconductor chip; and a resin package sealing the semiconductor chip, an inner terminal of the first lead, and an inner terminal of the second lead;

wherein the resin package includes a first to a fourth side surfaces, an upper surface and a bottom surface, wherein each of the first and the second leads includes at least one outer terminal located near a corner portion of the resin package and extending along a same side surface of the first to the fourth side surfaces, another of the side surfaces adjacent to said same side surface and the bottom surface of the resin package;

wherein the outer terminal of the first lead includes a drop portion extending from the corresponding inner terminal along the first side surface of the resin package, a bottom portion extending from the drop portion along the bottom surface of the resin package, and a riser portion extending from the bottom portion along the third side surface of the resin package, and wherein the outer terminal of the second lead includes a drop portion extending from the corresponding inner terminal along the first side surface of the resin package, a bottom portion extending from the drop portion along the bottom surface of the resin package, and a riser portion extending from the bottom portion along the fourth side surface opposite to the third side surface, of the resin package.

2. The semiconductor device according to claim 1, wherein the semiconductor chip is mounted on the inner terminal of the first lead, the inner terminal of the second lead being connected to the semiconductor chip via a wire.

3. The semiconductor device according to claim 2, wherein the connection between the inner terminal of the second lead and the wire is made substantially at a longitudinal center of the resin package.

4. The semiconductor device according to claim 1, wherein the semiconductor chip is a light emitting element or a light receiving element, the upper surface of the resin package being provided with a convex lens portion at a location corresponding to the semiconductor chip.

5. A semiconductor device comprising:

a semiconductor chip;

a first lead connected to an electrode of the semiconductor chip;

a second lead connected to another electrode of the semiconductor chip; and a resin package sealing the semiconductor chip, an inner terminal of the first lead, and an inner terminal of the second lead;

wherein the resin package includes a first to a fourth side surfaces, an upper surface and a bottom surface, wherein each of the first and the second leads includes at least one outer terminal located near a corner portion of the resin package and extending along a same side surface of the first to the fourth side surfaces, another of the side surfaces adjacent to said same side surface and the bottom surface of the resin package;

wherein the outer terminal of the first lead includes a drop portion extending from the corresponding inner terminal along the first side surface of the resin package, a bottom portion extending from the drop portion along the bottom surface of the resin package, and a riser portion extending from the bottom portion along the third side surface of the resin package, and wherein the outer terminal of the second lead includes a drop portion extending from the corresponding inner terminal along the second side surface opposite to the first side surface of the resin package, a bottom portion extending from the drop portion along the bottom surface of the resin package, and a riser portion extending from the bottom portion along the third side surface of the resin package.

6. A semiconductor device comprising:

a semiconductor chip;

a first lead connected to an electrode of the semiconductor chip;

a second lead connected to another electrode of the semiconductor chip; and a resin package sealing the semiconductor chip, an inner terminal of the first lead, and an inner terminal of the second lead;

wherein the resin package includes a first to a fourth side surfaces, an upper surface and a bottom surface, wherein each of the first and the second leads includes at least one outer terminal located near a corner portion of the resin package and extending along a same side surface of the first to the fourth side surfaces, another of the side surfaces adjacent to said same side surface and the bottom surface of the resin package;

wherein the outer terminal of the first lead includes a drop portion extending from the corresponding inner terminal along the third side surface of the resin package, a bottom portion extending from the drop portion along the bottom surface of the resin package, and a riser portion extending from the bottom portion along the first side surface of the resin package, and wherein the outer terminal of the second lead includes a drop portion extending from the corresponding inner terminal along the third side surface of the resin package, a bottom portion extending from the drop portion along the bottom surface of the resin package, and a riser portion extending from the bottom portion along the second side surface opposite to the first side surface of the resin package.

7. A semiconductor device comprising:

a semiconductor chip;

a first lead connected to an electrode of the semiconductor chip;

a second lead connected to another electrode of the semiconductor chip; and a resin package sealing the semiconductor chip, an inner terminal of the first lead, and an inner terminal of the second lead;

wherein the resin package includes a first to a fourth side surfaces, an upper surface and a bottom surface, wherein each of the first and the second leads includes at least one outer terminal located near a corner portion of the resin package and extending along a same side surface of the first to the fourth side surfaces, another of the side surfaces adjacent to said same side surface and the bottom surface of the resin package;

wherein the outer terminal of the first lead includes two branch portions, one of the branch portions being bent to extend along the first side surface and the bottom surface of the resin package, the other branch portion being bent to extend along the first side surface and the third side surface of the resin package, and wherein the outer terminal of the second lead includes two branch portions, one of the branch portions being bent to extend along the first side surface and the bottom surface of the resin package, the other branch portion being bent to extend along the first side surface and the fourth side surface opposite to the third side surface of the resin package.

8. A semiconductor device comprising:

a semiconductor chip;

a first lead connected to an electrode of the semiconductor chip;

a second lead connected to another electrode of the semiconductor chip; and a resin package sealing the semiconductor chip, an inner terminal of the first lead, and an inner terminal of the second lead;

wherein the resin package includes a first to a fourth side surfaces, an upper surface and a bottom surface, wherein each of the first and the second leads includes at least one outer terminal located near a corner portion of the resin package and extending along a same side surface of the first to the fourth side surfaces, another of the side surfaces adjacent to said same side surface and the bottom surface of the resin package;

wherein the outer terminal of the first lead includes two branch portions, one of the branch portions being bent to extend along the first side surface and the bottom surface of the resin package, the other branch portion being bent to extend along the first side surface and the third side surface of the resin package, and wherein the outer terminal of the second lead includes two branch portions, one of the branch portions being bent to extend along the second side surface opposite to the first side surface and the bottom surface of the resin package, the other branch portion being bent to extend along the second side surface and the third side surface of the resin package.

9. A semiconductor device comprising:

a semiconductor chip;

a first lead connected to an electrode of the semiconductor chip;

a second lead connected to another electrode of the semiconductor chip; and a resin package sealing the semiconductor chip, an inner terminal of the first lead, and an inner terminal of the second lead;

wherein the resin package includes a first to a fourth side surfaces, an upper surface and a bottom surface, wherein each of the first and the second leads includes at least one outer terminal located near a corner portion of the resin package and extending along a same side surface of the first to the fourth side surfaces, another of the side surfaces adjacent to said same side surface and the bottom surface of the resin package;

wherein the outer terminal of the first lead includes two branch portions, one of the branch portions being bent to extend along the third side surface and the bottom surface of the resin package, the other branch portion being bent to extend along the third side surface and the first side surface of the resin package, and wherein the outer terminal of the second lead includes two branch portions, one of the branch portions being bent to extend along the third side surface and the bottom surface of the resin package, the other branch portion being bent to extend along the third side surface and the second side surface opposite to the first side surface of the resin package.

10. A semiconductor device comprising:

a semiconductor chip;

a resin package sealing the semiconductor chip;

four outer terminals outside of the resin package, electrically connected to the semiconductor chip;

wherein the resin package includes four side surfaces, an upper surface and a bottom surface;

wherein the four outer terminals are disposed respectively at four corners on the bottom surface; and wherein each of the outer terminals extends along a selected one of the side surfaces, another of the side surfaces adjacent to the selected side surface, and the bottom surface of the resin package;

wherein each of the outer terminals includes a drop portion extending along the selected side surface of the resin package, a bottom portion extending from the drop portion, along the bottom portion of the resin package, and a riser portion extending from the bottom portion along another side surface of the resin package adjacent to the selected side surface.

11. The semiconductor device according to claim 10, wherein two of the four outer terminals are connected together by a first inner terminal, the remaining two of the outer terminals being connected together by a second inner terminal, the semiconductor chip being mounted on the first inner terminal, the second inner terminal being connected to the semiconductor chip via a wire.

12. The semiconductor device according to claim 11, wherein the connection between the second inner terminal and the wire is made substantially at a longitudinal center of the resin package.

13. The semiconductor device according to claim 10, wherein the semiconductor chip is a light emitting element or a light receiving element, the upper surface of the resin package being provided with a convex lens portion at a location corresponding to the semiconductor chip.

* * * * *